United States Patent
Yonemura et al.

(10) Patent No.: US 8,668,310 B2
(45) Date of Patent: *Mar. 11, 2014

(54) LIQUID-EJECTING HEAD, LIQUID-EJECTING APPARATUS, PIEZOELECTRIC ELEMENT, AND PIEZOELECTRIC MATERIAL

(75) Inventors: Takayuki Yonemura, Suwa (JP); Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 165 days.

This patent is subject to a terminal disclaimer.

(21) Appl. No.: 12/914,321

(22) Filed: Oct. 28, 2010

(65) Prior Publication Data

US 2011/0102518 A1    May 5, 2011

(30) Foreign Application Priority Data

Nov. 2, 2009   (JP) .................. 2009-252444
Mar. 9, 2010   (JP) .................. 2010-052429
May 19, 2010   (JP) .................. 2010-115743

(51) Int. Cl.
*B41J 2/045* (2006.01)
*H01L 41/00* (2013.01)
*H02N 2/00* (2006.01)

(52) U.S. Cl.
USPC ............................. 347/68; 310/311

(58) Field of Classification Search
None
See application file for complete search history.

(56) References Cited

U.S. PATENT DOCUMENTS

| | | | |
|---|---|---|---|
| 7,216,962 B2 | 5/2007 | Miyazawa et al. |
| 7,759,846 B2 | 7/2010 | Sakashita et al. |
| 8,177,995 B2 | 5/2012 | Kobayashi et al. |
| 2006/0131627 A1 | 6/2006 | Kondo et al. |
| 2008/0239016 A1 | 10/2008 | Miura |
| 2008/0265718 A1 | 10/2008 | Sakashita et al. |
| 2008/0278038 A1 | 11/2008 | Kobayashi et al. |
| 2009/0267998 A1 | 10/2009 | Sakashita et al. |

FOREIGN PATENT DOCUMENTS

| | | |
|---|---|---|
| JP | 08-17245 | 1/1996 |
| JP | 10-052071 | 2/1998 |
| JP | 2000-127392 | 5/2000 |
| JP | 2001-223404 | 8/2001 |
| JP | 2001-335362 | 12/2001 |
| JP | 2005-39166 | 2/2005 |
| JP | 2006-176366 | 7/2006 |
| JP | 2007-116091 | 5/2007 |
| JP | 2007-194429 | 8/2007 |

(Continued)

OTHER PUBLICATIONS

Zhang et al, Preparation, structures, and multiferroic properties of single phase Bi1—xLaxFeO3 "x=0-0.40) ceramics, Apr. 19, 2006, Journal of Applied Plysics 100, 114108.*

(Continued)

*Primary Examiner* — Matthew Luu
*Assistant Examiner* — Erica Lin
(74) *Attorney, Agent, or Firm* — Workman Nydegger

(57) ABSTRACT

A liquid-ejecting head includes a pressure-generating chamber communicating with a nozzle opening, and a piezoelectric element. The piezoelectric element has piezoelectric layer contains a perovskite complex oxide containing Bi, La, Fe, and Mn and can undergo electric-field-induced phase transition.

11 Claims, 30 Drawing Sheets

(56) References Cited

FOREIGN PATENT DOCUMENTS

| JP | 2007-287739 | | | 11/2007 |
|---|---|---|---|---|
| JP | 2008-192868 | | | 8/2008 |
| JP | 2008-265289 | | | 11/2008 |
| JP | 2008-306164 | | | 12/2008 |
| JP | 2008-311634 | | | 12/2008 |
| JP | 4266036 | | | 2/2009 |
| JP | 2009-231482 | | | 10/2009 |
| JP | 2009231482 | A | * | 10/2009 |
| JP | 2009242229 | A | | 10/2009 |
| JP | 2009252789 | A | * | 10/2009 |
| JP | 2009-287066 | | | 12/2009 |

OTHER PUBLICATIONS

Singh et al, Room temperature ferroelectric properties of Mn-substituted BiFeO2 thin films deposited on Pt electrodes using chemical solution deposition, Jun. 30, 2006, Journal of Applied Physics 88, 262908.*

S. K. Singh et al "Room temperature ferroelectric properties of Mn-substituted $BiFeO_3$ thin films deposited on Pt electrodes using chemical solution deposition" Applied Physics Letters 88, 262908 (2006).

S. Fujino, et al "Combinatorial discovery of a lead-free morphotropic phase boundary in a thin-film piezoelectric perovskite" Applied Physics Letters 92, 202904 (2008).

A. Z. Simoes, et al "Piezoelectric behavior of $SrRuO_3$ buffered lanthanum modified bismuth ferrite thin films grown by chemical method" Applied Physics Letters 93, 142902 (2008).

G. L. Yuan, Siu Wing Or and Helen Lai Wa Chan, Structural transformation and ferroelectric-paraelectric phase transition in $Bi_{1-x}$, $La_xFeO_3$ (x = 0-0.25) multiferroic ceramics, J. Phys. D: Apply. US, Institute of Physics Publishing, Feb. 2007, Issue 4. p. 1996-1120.

High-Frequency Dielectric Study of Multiferroic $Bi_{0.9}La_{0.1}Fe_{0.9}Mn_{0.1}O_3$ Thin Films, Applications of Ferroelectrics, 2009. ISAF 2009. 18th IEEE International Symposium, US, The Institute of Electrical and Electronics Engineers, Inc., Aug. 23, 2009, 1-4.

* cited by examiner

LIQUID-EJECTING HEAD, LIQUID-EJECTING APPARATUS, PIEZOELECTRIC ELEMENT, AND PIEZOELECTRIC MATERIAL

CROSS-REFERENCE TO RELATED APPLICATIONS

This application claims the benefit of priority to Japanese Patent Application No. 2009-252444 filed Nov. 2, 2009, Japanese Patent Application No. 2010-052429 filed Mar. 9, 2010, and Japanese Patent Application No. 2010-115743 filed May 19, 2010, the contents of which are hereby incorporated by reference in their entirety.

BACKGROUND

1. Technical Field

The present invention relates to a liquid-ejecting head that includes a piezoelectric element, a liquid-ejecting apparatus, the piezoelectric element, and a piezoelectric material. The piezoelectric element includes a first electrode for altering the internal pressure of a pressure-generating chamber communicating with a nozzle opening, a piezoelectric layer, and a second electrode.

2. Related Art

One example of piezoelectric elements for use in liquid-ejecting heads is a piezoelectric layer between two electrodes. The piezoelectric layer is formed of a piezoelectric material having an electromechanical transfer function, such as a crystallized dielectric material. Such a piezoelectric element can be mounted on a liquid-ejecting head as an actuator in a flexural vibration mode. One representative example of liquid-ejecting heads is an ink jet print head. The ink jet print head has a diaphragm as part of a pressure-generating chamber, which communicates with a nozzle opening for discharging ink droplets. The diaphragm is deformed by a piezoelectric element to pressurize ink in the pressure-generating chamber, thereby discharging ink droplets from the nozzle opening. A piezoelectric element for use in such an ink jet print head can be produced by forming a uniform piezoelectric layer on the entire surface of a diaphragm by a film-forming technique and dividing the piezoelectric layer by lithography into pieces corresponding to each individual pressure-generating chamber.

The piezoelectric material used for such a piezoelectric element requires excellent piezoelectric characteristics (a large strain). One representative example of the piezoelectric material is lead zirconium titanate (PZT) (see JP-A-2001-223404).

However, from the standpoint of environmental protection, there is a demand for a piezoelectric material with little or no lead. Examples of a lead-free piezoelectric material include those having an $ABO_3$ perovskite structure, such as $BiFeO_3$. However, lead-free piezoelectric materials having an $ABO_3$ perovskite structure produce a smaller strain than lead zirconium titanate. These problems are not confined to liquid-ejecting heads, including ink jet print heads, and occur in other piezoelectric elements.

SUMMARY

An advantage of some aspects of the invention is that it provides a liquid-ejecting head that includes a piezoelectric element having a low environmental load and producing a large strain, a liquid-ejecting apparatus, the piezoelectric element, and a piezoelectric material.

In accordance with one aspect of the invention, a liquid-ejecting head includes a pressure-generating chamber communicating with a nozzle opening, and a piezoelectric element that includes a first electrode, a piezoelectric layer disposed on the first electrode, and a second electrode disposed on the piezoelectric layer, wherein the piezoelectric layer contains a perovskite complex oxide containing Bi, La, Fe, and Mn and can undergo electric-field-induced phase transition.

A piezoelectric material that contains a perovskite complex oxide containing Bi, La, Fe, and Mn and can undergo electric-field-induced phase transition is an antiferroelectric substance. Use of such an antiferroelectric substance can reduce the lead content and the environmental load and allows the piezoelectric element to produce a large strain.

In accordance with another aspect of the invention, a liquid-ejecting head includes a pressure-generating chamber communicating with a nozzle opening, and a piezoelectric element that includes a first electrode, a piezoelectric layer disposed on the first electrode, and a second electrode disposed on the piezoelectric layer, wherein the piezoelectric layer contains a complex oxide having the following general formula (1). The complex oxide having the following general formula (1) is an antiferroelectric substance. Use of such an antiferroelectric substance can reduce the lead content and the environmental load and allows the piezoelectric element to produce a large strain.

$$(Bi_{1-x}La_x)(Fe_{1-y}Mn_y)O_3 \tag{1}$$

$(0.21 \leq x \leq 0.38, 0.01 \leq y \leq 0.09)$

In the general formula (1), x is preferably in the range of $0.24 \leq x \leq 0.33$. In this range, the liquid-ejecting head can include a piezoelectric element that can produce a larger strain.

In the general formula (1), x is preferably in the range of $0.27 \leq x \leq 0.29$. This can stabilize the voltage at which a piezoelectric layer undergoes electric-field-induced phase transition and thereby allows the strain of the piezoelectric element to be easily controlled.

In the general formula (1), y is preferably in the range of $0.01 \leq y \leq 0.05$. In this range, the piezoelectric layer has excellent insulating properties and can prevent dielectric breakdown of the liquid-ejecting head caused by an electric leakage.

In accordance with another aspect of the invention, a liquid-ejecting apparatus includes a liquid-ejecting head according to any of the aspects described above. Use of such a liquid-ejecting head can reduce the lead content and the environmental load. In addition, the liquid-ejecting head includes a piezoelectric element that can produce a large strain. Thus, the liquid-ejecting apparatus has excellent piezoelectric characteristics without adversely affecting the environment.

In accordance with still another aspect of the invention, a piezoelectric element includes a piezoelectric layer and a plurality of electrodes disposed on the piezoelectric layer, wherein the piezoelectric layer contains a perovskite complex oxide containing Bi, La, Fe, and Mn and can undergo electric-field-induced phase transition. A piezoelectric material that contains a perovskite complex oxide containing Bi, La, Fe, and Mn and can undergo electric-field-induced phase transition is an antiferroelectric substance. Use of such an antiferroelectric substance can reduce the lead content and the environmental load and allows the piezoelectric element to produce a large strain.

In accordance with still another aspect of the invention, a piezoelectric element includes a piezoelectric layer and a plurality of electrodes disposed on the piezoelectric layer, wherein the piezoelectric layer contains a complex oxide having the following general formula (1). The complex oxide having the following general formula (1) is an antiferroelectric substance. Use of such an antiferroelectric substance can reduce the lead content and the environmental load and allows the piezoelectric element to produce a large strain.

$$(Bi_{1-x},La_x)(Fe_{1-y},Mn_y)O_3 \quad (1)$$

$$(0.21 \leq x \leq 0.38, 0.01 \leq y \leq 0.09)$$

In accordance with still another aspect of the invention, a piezoelectric material contains a perovskite complex oxide containing Bi, La, Fe, and Mn and can undergo electric-field-induced phase transition. The piezoelectric material can reduce the lead content and the environmental load and produce a large strain.

In accordance with still another aspect of the invention, a piezoelectric material contains a perovskite complex oxide having the following general formula (1). The perovskite complex oxide having the following general formula (1) is an antiferroelectric substance. Use of such an antiferroelectric substance can reduce the lead content and the environmental load and allows the piezoelectric material to produce a large strain.

$$(Bi_{1-x},La_x)(Fe_{1-y},Mn_y)O_3 \quad (1)$$

$$(0.21 \leq x \leq 0.38, 0.01 \leq y \leq 0.09)$$

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
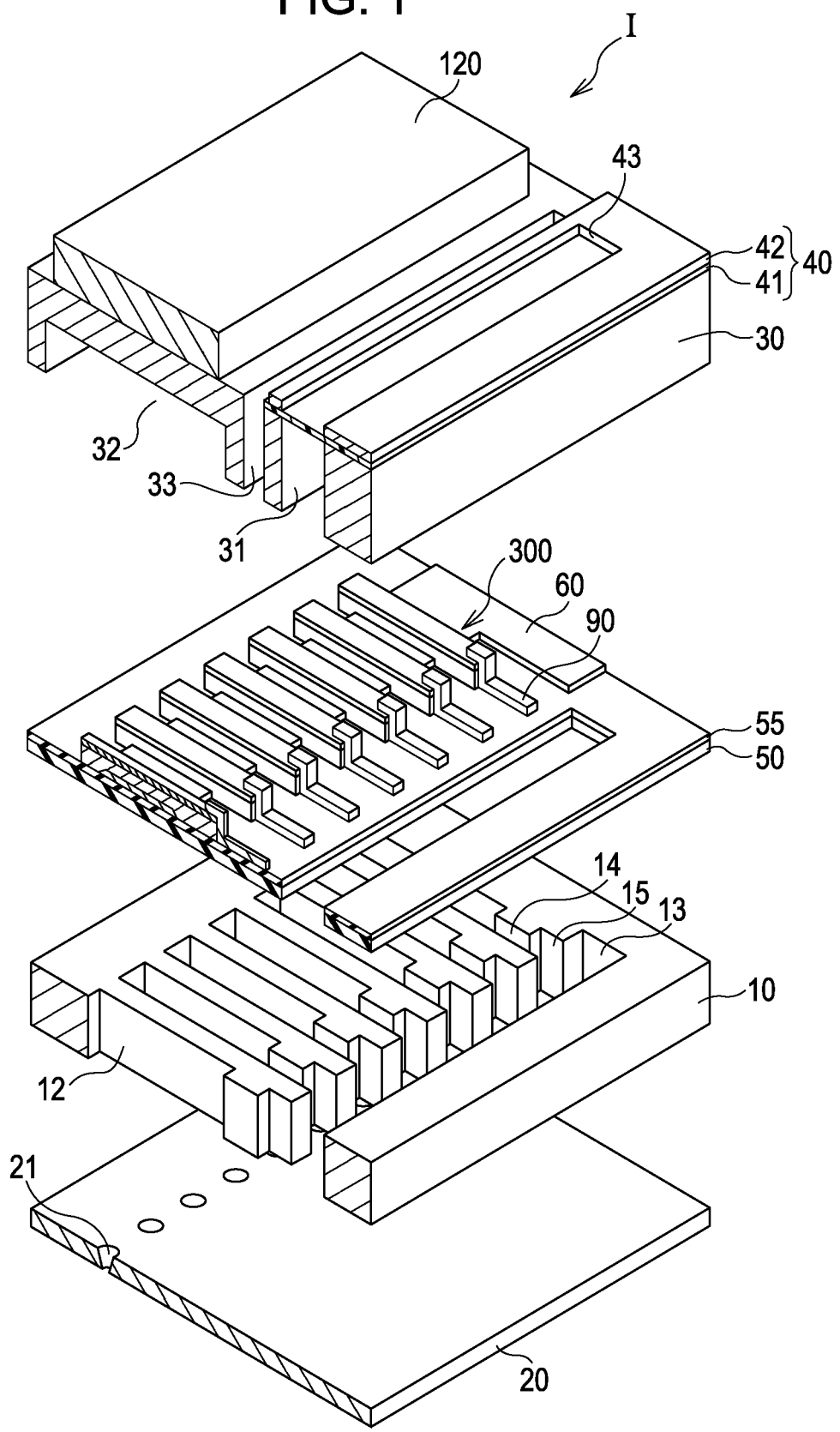
FIG. 1 is a schematic exploded perspective view of a print head according to a first embodiment.
Figure 2A:
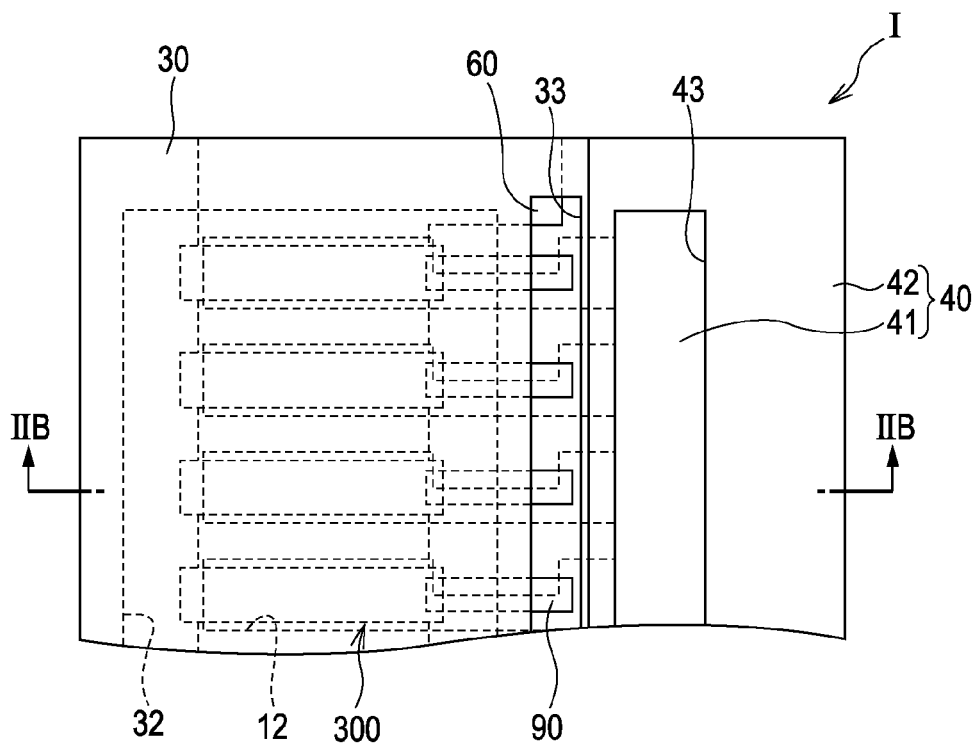
FIG. 2A is a plan view of the print head according to the first embodiment.
Figure 2B:
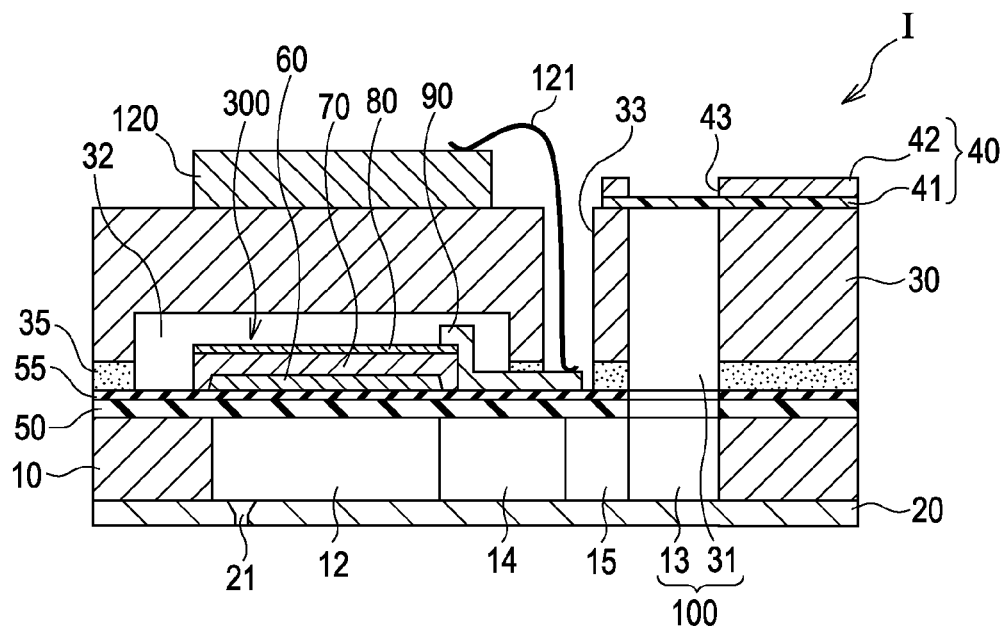
FIG. 2B is a cross-sectional view of the print head taken along the line IIB-IIB of FIG. 2A.

FIG. 1 is an exploded perspective view of an ink jet print head according to a first embodiment of the invention. This ink jet print head is an example of a liquid-ejecting head. FIG. 2A is a plan view of the ink jet print head according to the first embodiment. FIG. 2B is a cross-sectional view of the ink jet print head taken along the line IIB-IIB of FIG. 2A.

As illustrated in FIGS. 1 and 2, a flow-passage-forming substrate 10 according to the present embodiment is a silicon single crystal substrate. A silicon dioxide elastic film 50 is disposed on the flow-passage-forming substrate 10.

The flow-passage-forming substrate 10 includes a plurality of pressure-generating chambers 12 juxtaposed to each other in the width direction. The flow-passage-forming substrate 10 further includes a communication portion 13 outside the pressure-generating chambers 12 in the longitudinal direction. The communication portion 13 is in communication with the pressure-generating chambers 12 through corresponding ink feed channels 14 and communication paths 15. The communication portion 13 in communication with a reservoir portion 31 in a protective substrate described below constitutes part of a reservoir, which is a common ink chamber of the pressure-generating chambers 12. The ink feed channels 14 have a smaller width than the pressure-generating chambers 12, producing a constant flow resistance against ink flowing from the communication portion 13 to the pressure-generating chambers 12. While each of the flow passages is narrowed at one side thereof in the present embodiment, each of the flow passages may be narrowed at both sides thereof to form the ink feed channels 14. Alternatively, instead of reducing the width of the flow passages, the thickness of the flow passages may be reduced to form the ink feed channels 14. Thus, the flow-passage-forming substrate 10 includes liquid flow passages, which are composed of the pressure-generating chambers 12, the communication portion 13, the ink feed channels 14, and the communication paths 15.

The opening surface of the flow-passage-forming substrate 10 is attached to a nozzle plate 20 with an adhesive, a heat-seal film, or the like. The nozzle plate 20 has nozzle openings 21 near the ends of the pressure-generating chambers 12 opposite the ink feed channels 14. The nozzle plate 20 is formed of glass ceramic, a silicon single crystal, or stainless steel, for example.

As described above, the elastic film 50 is disposed opposite the opening surface of the flow-passage-forming substrate 10. An insulator film 55 formed of, for example, zirconium oxide is formed on the elastic film 50.

A piezoelectric element 300 is disposed on the insulator film 55 and includes a first electrode 60, a piezoelectric layer 70, and a second electrode 80. The piezoelectric layer 70 has a thickness of 2 μm or less, preferably in the range of 0.3 to 1.5 μm. A titanium oxide layer may be disposed between the piezoelectric element 300 and the insulator film 55 to improve the adhesion therebetween. In general, one of the electrodes of the piezoelectric element 300 serves as a common electrode, and the other electrode and the piezoelectric layer 70 are patterned for each of the pressure-generating chambers 12. In the present embodiment, the first electrode 60 serves as the common electrode of the piezoelectric elements 300 and the second electrode 80 serves as an individual electrode of the corresponding piezoelectric element 300. However, for the convenience of a drive circuit or wiring, the first electrode 60 may serve as the individual electrode and the second electrode 80 may serve as the common electrode. A combination of a piezoelectric element 300 and a diaphragm is herein referred to as an actuator. The diaphragm can be deformed by the operation of the piezoelectric element 300. Although the elastic film 50, the insulator film 55, and the first electrode 60 function as the diaphragm in the present embodiment, the diaphragm is not limited to this structure. For example, the first electrode 60 alone may function as the diaphragm. Alternatively, the piezoelectric element 300 may function as the diaphragm.

The piezoelectric layer 70 is formed of a perovskite complex oxide containing Bi, La, Fe, and Mn and can undergo electric-field-induced phase transition. More specifically, for example, the piezoelectric layer 70 is formed of an $ABO_3$ complex oxide having the following general formula (1). As shown in the examples described below, the $ABO_3$ complex oxide having the following general formula (1) can undergo electric-field-induced phase transition. As shown in the examples and comparative examples described below, depending on the composition, the $ABO_3$ complex oxide containing Bi, La, Fe, and Mn may be a ferroelectric substance or an antiferroelectric substance.

$$(Bi_{1-x}La_x)(Fe_{1-y}Mn_y)O_3 \quad (1)$$

$(0.21 \leq x \leq 0.38, 0.01 \leq y \leq 0.09)$

In the perovskite $ABO_3$ structure, the A sites have oxygen atoms in 12-fold coordination, and the B sites have oxygen atoms in 6-fold coordination, forming an octahedron. Bi and La are located at the A sites, and Fe and Mn are located at the B sites.

The term "electric-field-induced phase transition" means phase transition induced by an electric field and includes phase transition from an antiferroelectric phase to a ferroelectric phase and phase transition from a ferroelectric phase to an antiferroelectric phase. The term "ferroelectric phase" means that spontaneous polarization occurs unidirectionally. The term "antiferroelectric phase" means that adjacent dipoles are oriented in antiparallel directions. For example, in phase transition from an antiferroelectric phase to a ferroelectric phase, some adjacent dipoles oriented in antiparallel directions in the antiferroelectric phase are inverted such that the dipoles are oriented unidirectionally. Such electric-field-induced phase transition expands or contracts lattices to produce a strain (electric-field-induced phase transition strain).

Figure 3:
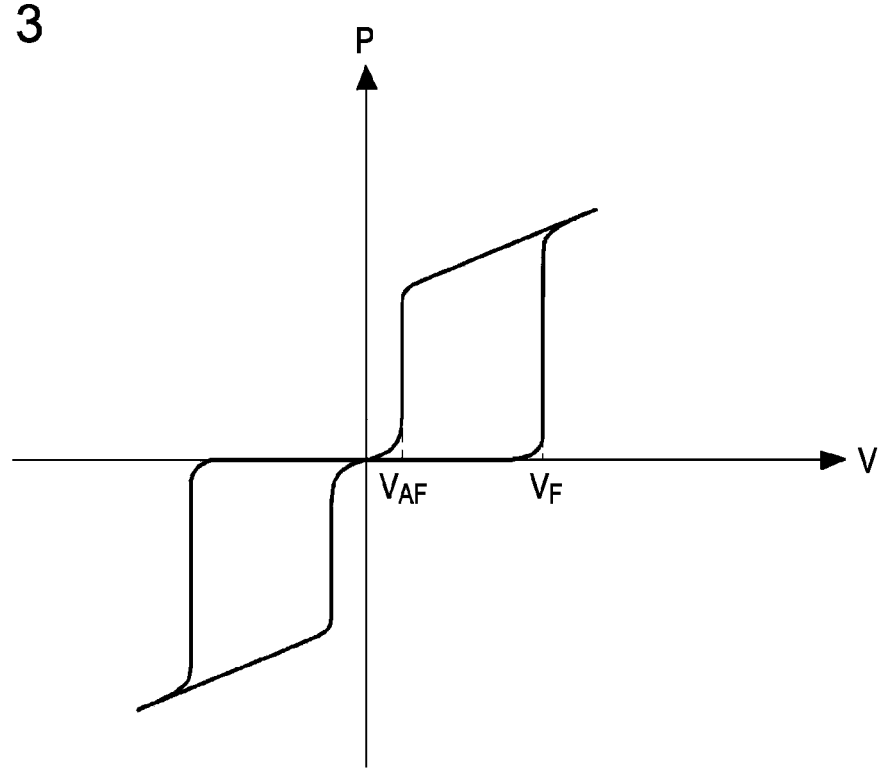
FIG. 3 is a graph showing the P-V hysteresis of an antiferroelectric substance.
Figure 4:
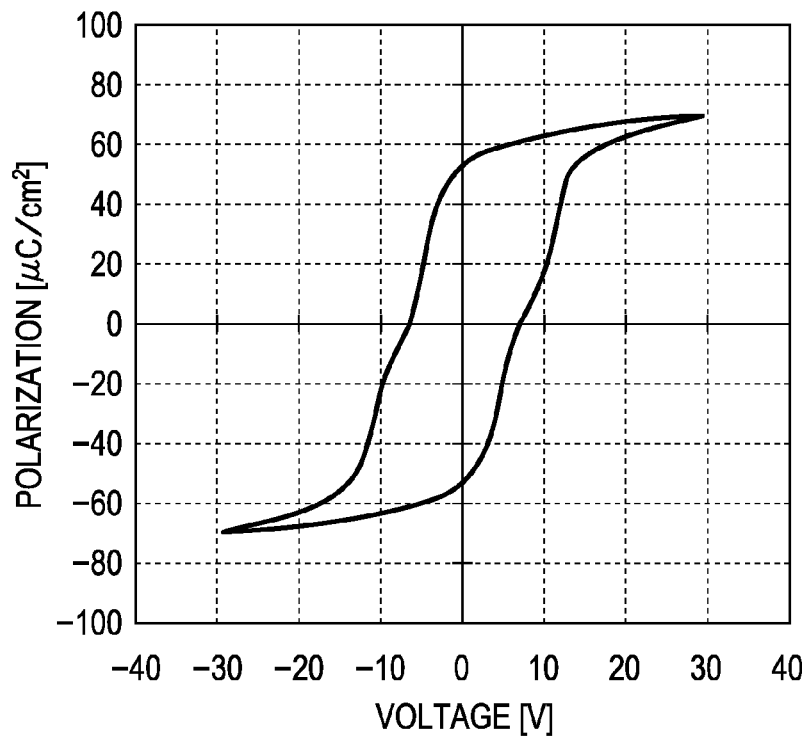
FIG. 4 is a graph showing a P-V curve according to Example 1.
Figure 5:
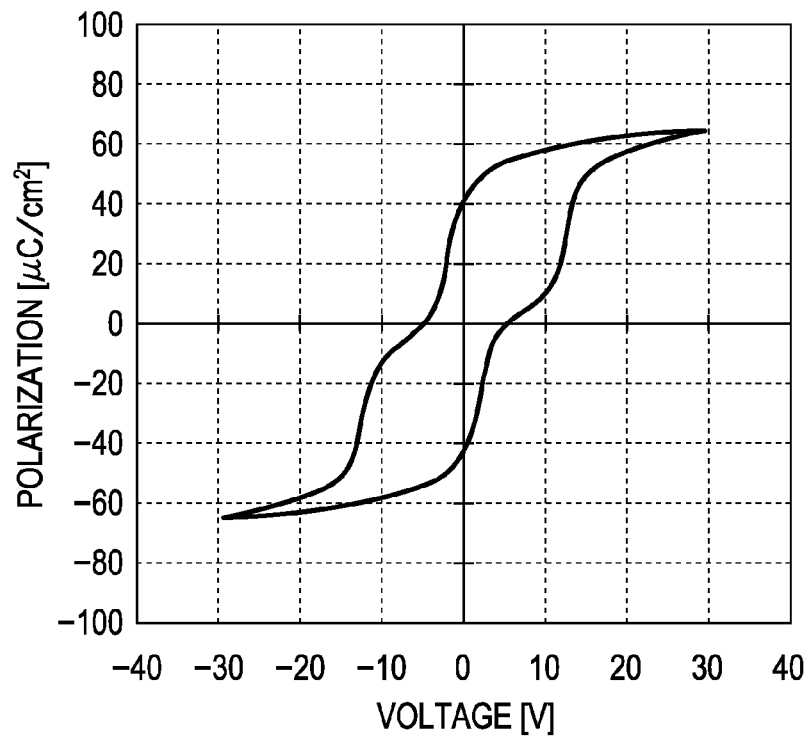
FIG. 5 is a graph showing a P-V curve according to Example 2.
Figure 6:
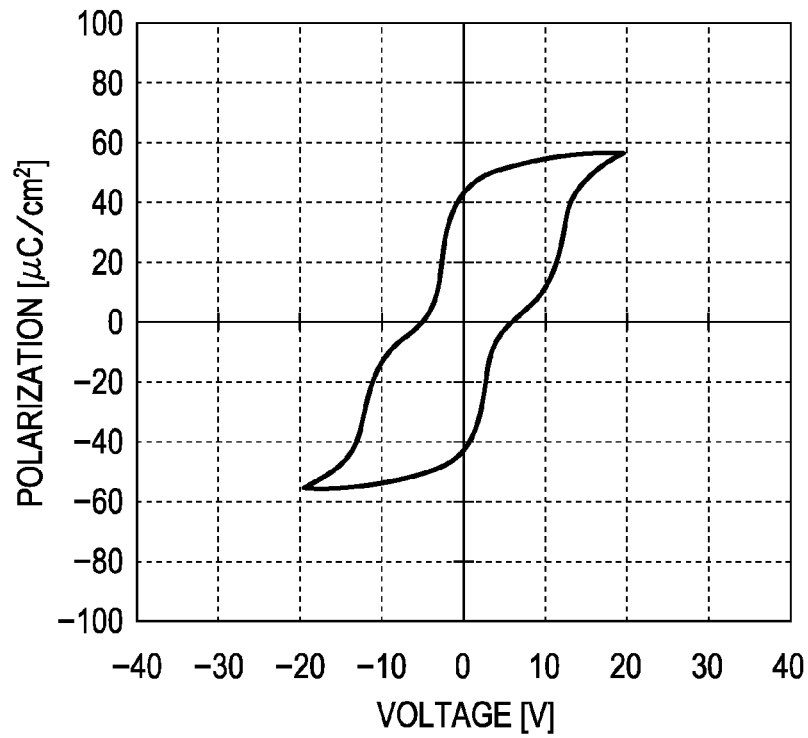
FIG. 6 is a graph showing a P-V curve according to Example 3.
Figure 7:
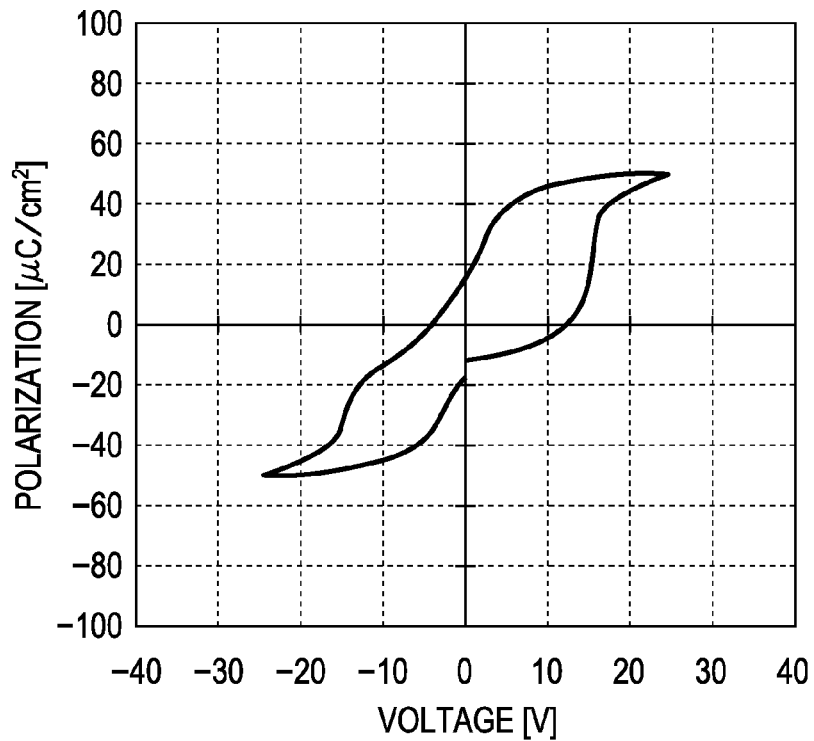
FIG. 7 is a graph showing a P-V curve according to Example 4.
Figure 8:
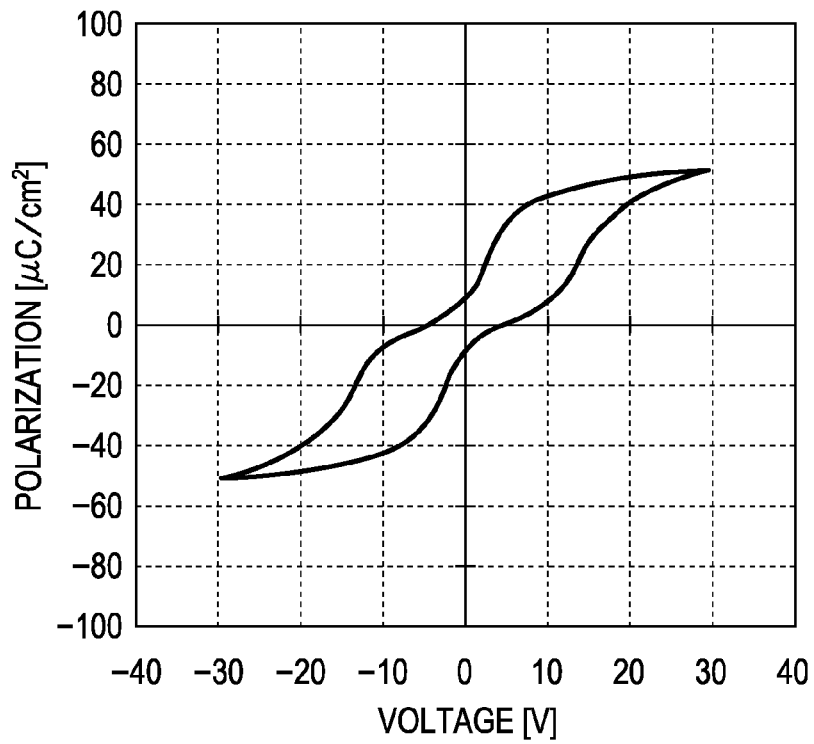
FIG. 8 is a graph showing a P-V curve according to Example 5.
Figure 9:
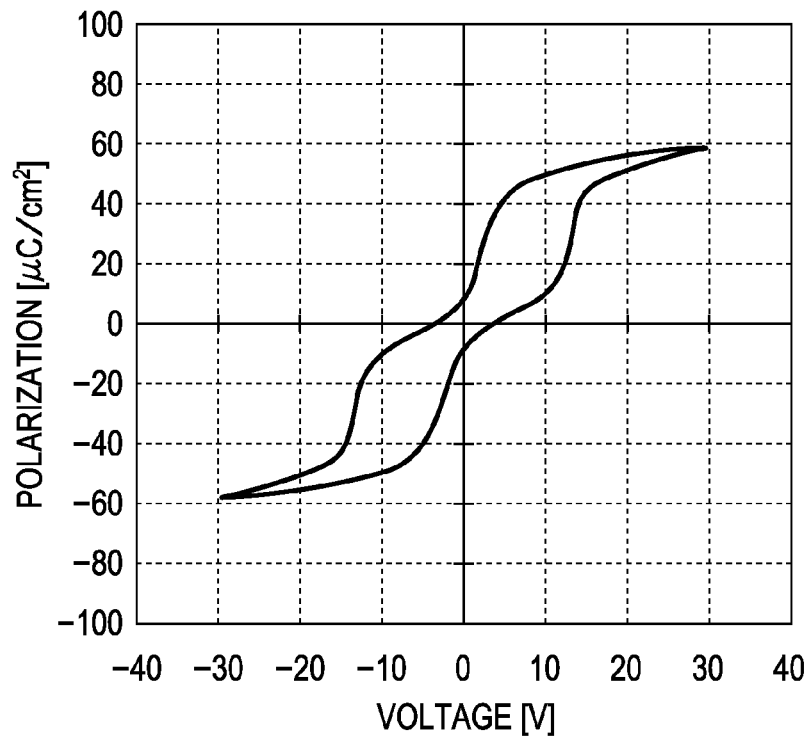
FIG. 9 is a graph showing a P-V curve according to Example 6.
Figure 10:
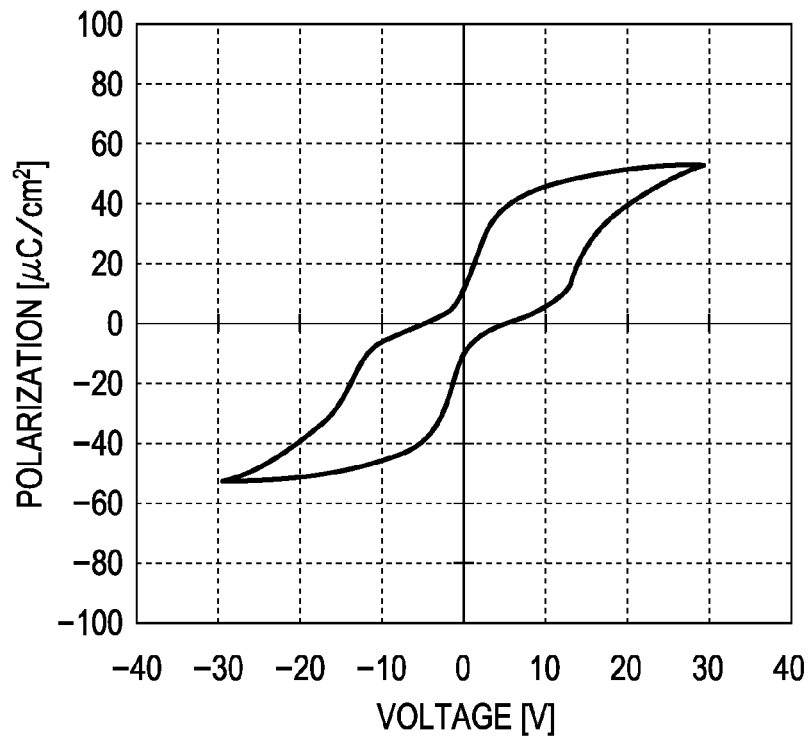
FIG. 10 is a graph showing a P-V curve according to Example 7.
Figure 11:
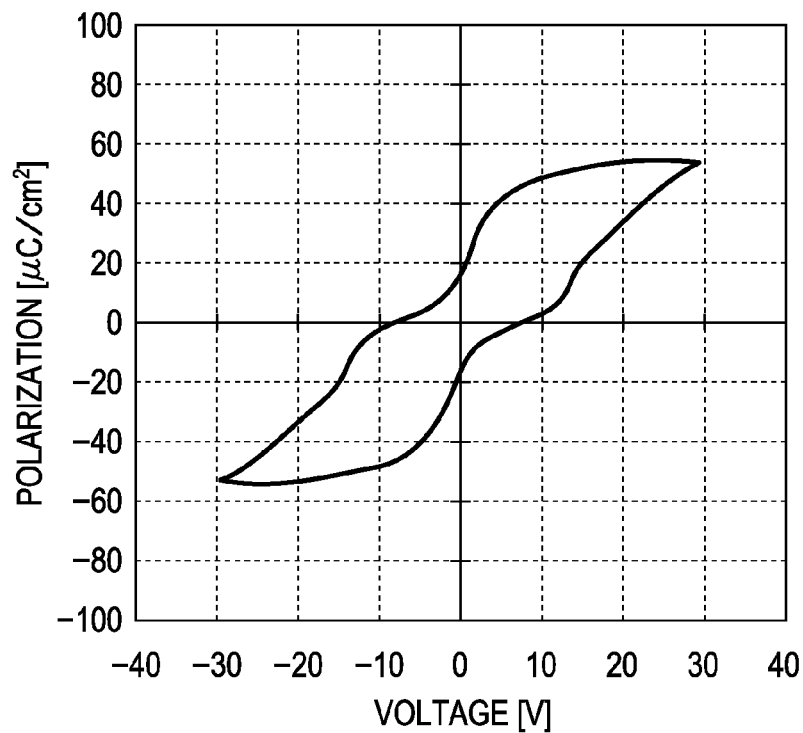
FIG. 11 is a graph showing a P-V curve according to Example 8.
Figure 12:
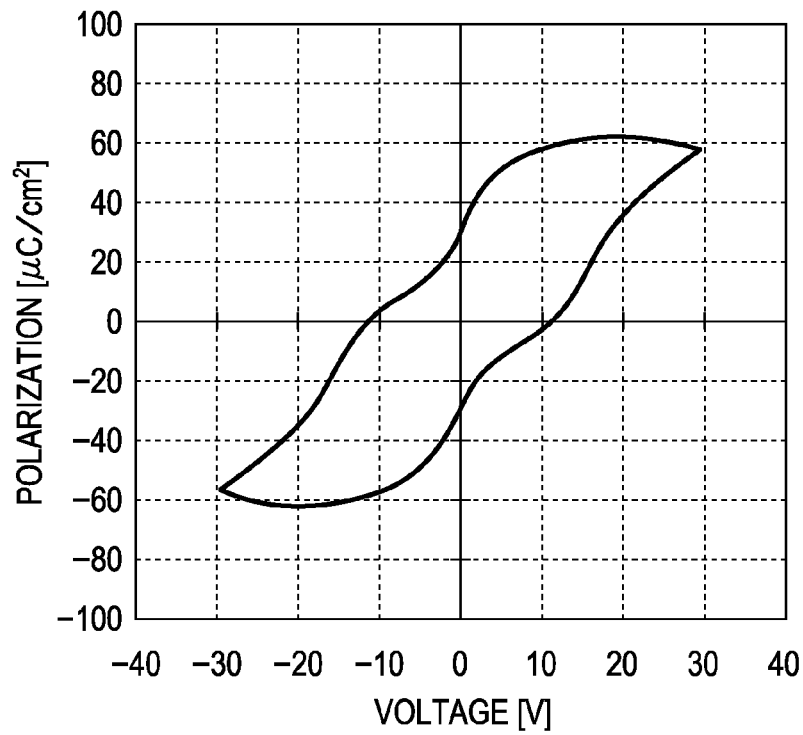
FIG. 12 is a graph showing a P-V curve according to Example 9.
Figure 13:
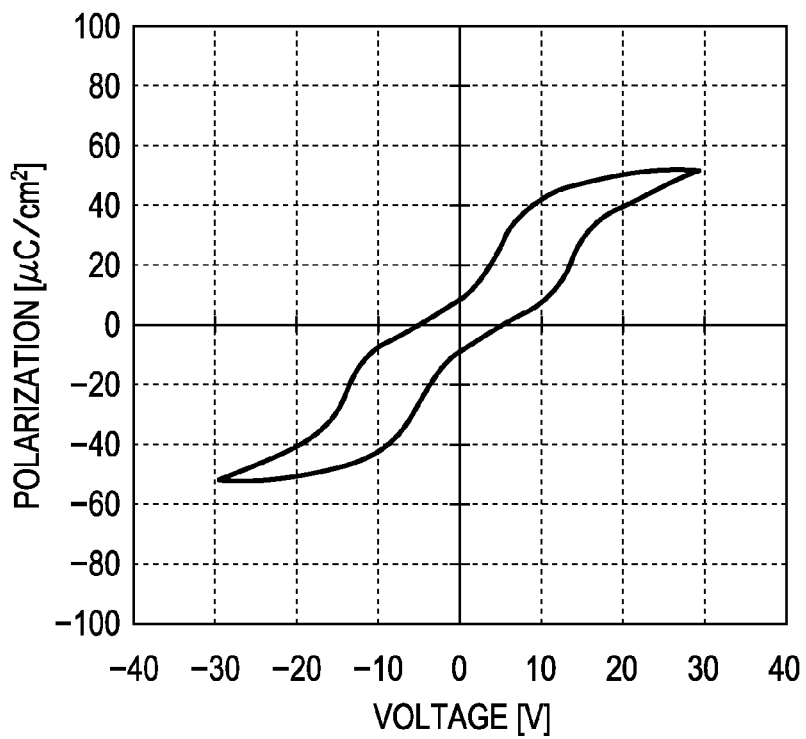
FIG. 13 is a graph showing a P-V curve according to Example 10.
Figure 14:
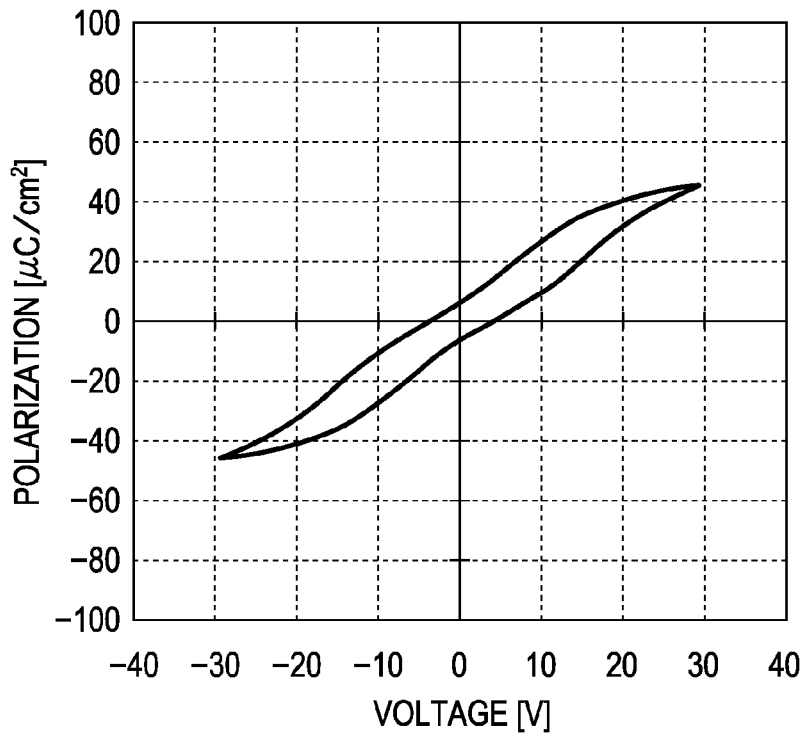
FIG. 14 is a graph showing a P-V curve according to Example 11.
Figure 15:
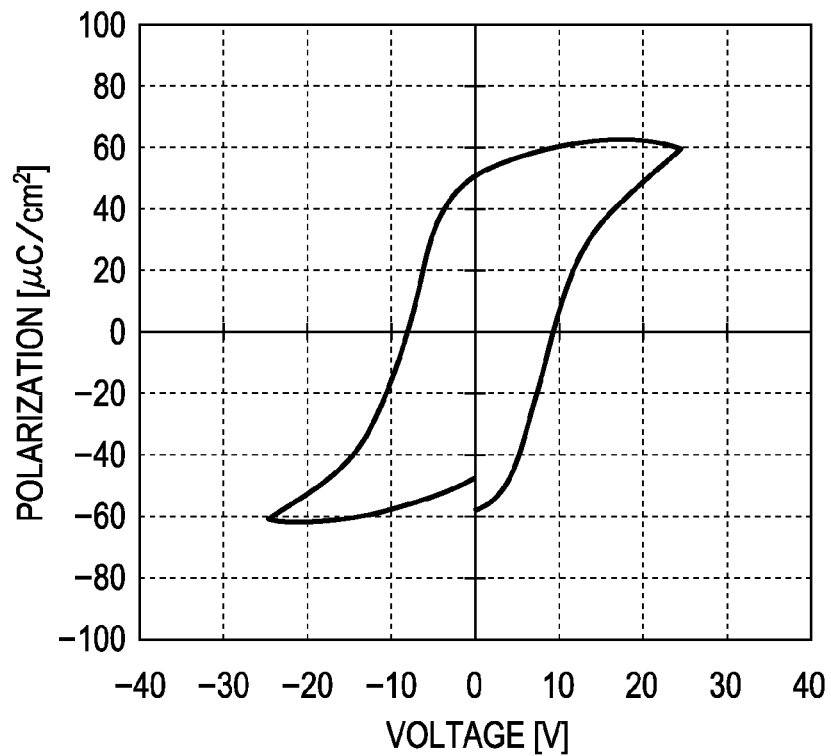
FIG. 15 is a graph showing a P-V curve according to Comparative Example 1.
Figure 16:
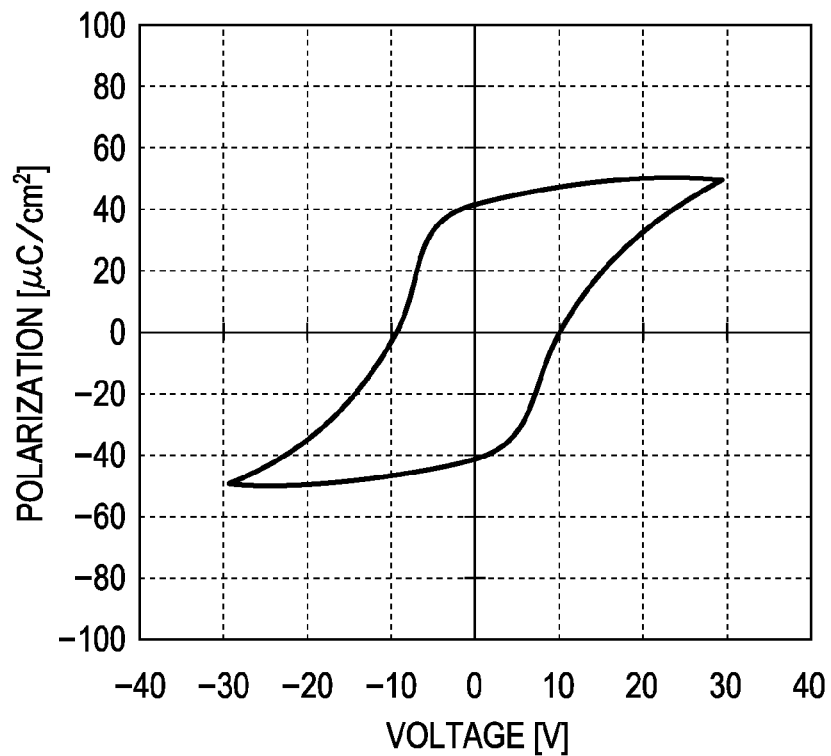
FIG. 16 is a graph showing a P-V curve according to Comparative Example 2.
Figure 17:
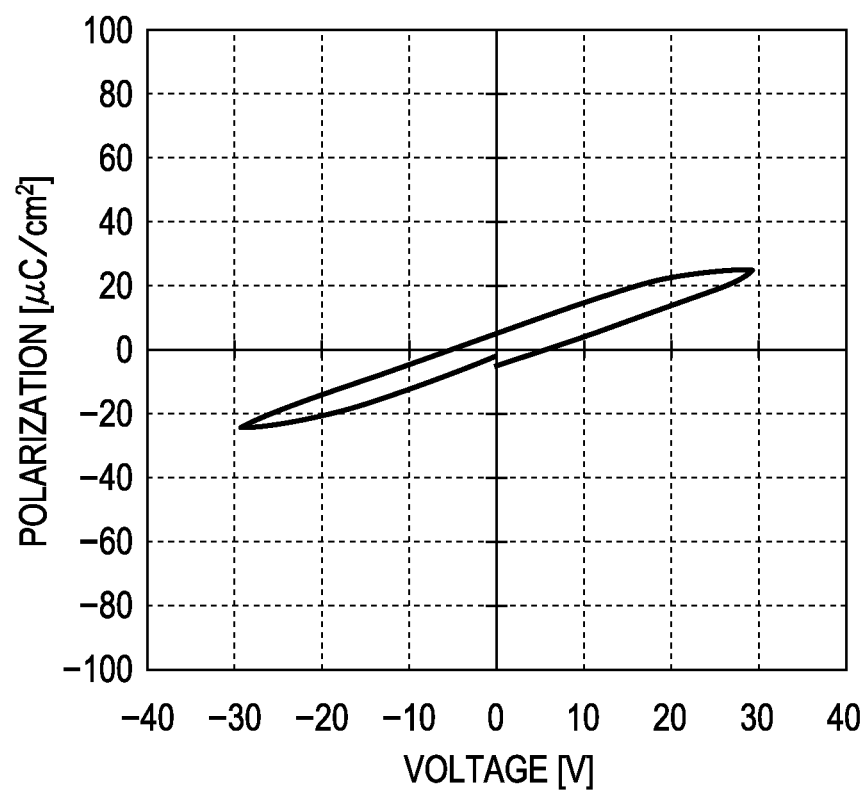
FIG. 17 is a graph showing a P-V curve according to Comparative Example 3.

A substance that can undergo electric-field-induced phase transition is an antiferroelectric substance. Thus, in an antiferroelectric substance, some adjacent dipoles oriented in antiparallel directions in the absence of an electric field are inverted such that the dipoles are oriented unidirectionally upon the application of an electric field. FIG. 3 is a P-V curve showing the amount of polarization P of an antiferroelectric substance as a function of voltage V. The antiferroelectric substance has double hysteresis loops in the positive electric field direction and the negative electric field direction. The amount of polarization changes drastically in regions $V_F$ and $V_{AF}$, in which phase transition occurs from a ferroelectric phase to an antiferroelectric phase and from an antiferroelectric phase to a ferroelectric phase. Unlike the antiferroelectric substance, a ferroelectric substance is polarized unidirectionally and has a hysteresis P-V curve in which the piezoelectric strain increases linearly with voltage applied.

In the case that a piezoelectric layer contains an $ABO_3$ complex oxide containing Bi, La, Fe, and Mn and can undergo electric-field-induced phase transition, the amount of polarization changes greatly in an electric-field-induced phase transition region, producing an electric-field-induced phase transition strain. This can increase the strain of the piezoelectric element while reducing the lead content and the environmental load.

When x is in the range of $0.24 \leq x \leq 0.33$ in the general formula (1), the piezoelectric element can produce a larger strain. When x is in the range of $0.27 \leq x \leq 0.29$, the voltage at which the piezoelectric layer 70 undergoes electric-field-induced phase transition can be stabilized. This allows the strain of the piezoelectric element to be easily controlled. When y is in the range of $0.01 \leq y \leq 0.05$, the piezoelectric layer 70 also has high leakage resistance.

The piezoelectric element 300 can be formed on the flow-passage-forming substrate 10 by any method, including the following method. First, a silicon dioxide ($SiO_2$) film is formed as the elastic film 50 on a silicon wafer used as the flow-passage-forming substrate 10. A zirconium oxide insulator film 55 is then formed on the elastic film 50 (silicon dioxide film).

If necessary, a titanium oxide layer is formed on the insulator film 55. A platinum or iridium first electrode 60 is then formed on the entire surface by sputtering and is patterned.

A piezoelectric layer 70 is then formed on the first electrode 60. The piezoelectric layer 70 may be formed by any method, including metal-organic decomposition (MOD). In MOD, an organometallic compound dissolved or dispersed in a solvent is applied to the first electrode 60, is dried, and is fired at a high temperature to form the piezoelectric layer 70 formed of a metal oxide. The piezoelectric layer 70 may also be formed by a sol-gel method, laser ablation, sputtering, pulse laser deposition (PLD), CVD, or aerosol deposition.

For example, a sol or MOD solution (precursor solution) that contains an organometallic compound, more specifically, an organometallic compound containing bismuth, lanthanum, iron, and manganese at a predetermined ratio is applied to the first electrode 60 by spin coating to form a piezoelectric precursor film (a coating step).

The precursor solution is prepared by mixing organometallic compounds containing bismuth, lanthanum, iron, or manganese such that the metals are contained at a desired molar ratio, and dissolving or dispersing the mixture in an organic solvent, such as an alcohol. Examples of the organometallic compounds containing bismuth, lanthanum, iron, or manganese include metal alkoxides, organic acid salts, and β-diketone complexes. An exemplary organometallic compound containing bismuth is bismuth 2-ethylhexanoate. An exemplary organometallic compound containing lanthanum is lanthanum 2-ethylhexanoate. An exemplary organometallic compound containing iron is iron 2-ethylhexanoate. An exemplary organometallic compound containing manganese is manganese 2-ethylhexanoate.

The piezoelectric precursor film is then heated at a predetermined temperature for a predetermined period of time for drying (a drying step). The dried piezoelectric precursor film is then heated at a predetermined temperature for a predetermined period of time for degreasing (a degreasing step). The term "degreasing", as used herein, means that organic components contained in the piezoelectric precursor film are removed as $NO_2$, $CO_2$, and/or $H_2O$, for example.

The piezoelectric precursor film is then heated at a predetermined temperature, for example, approximately in the range of 600° C. to 700° C., for a predetermined period of time to form a piezoelectric film by crystallization (a sitering step). Examples of a heater used in the drying step, the degreasing step, and the sitering step include a hot plate and a rapid thermal annealing (RTA) apparatus. RTA involves heating by infrared lamp irradiation.

Depending on the desired film thickness, the coating step, the drying step, the degreasing step, and optionally the sitering step may be performed more than once to form a piezoelectric layer composed of a plurality of piezoelectric films.

After the formation of the piezoelectric layer 70, a second electrode 80, for example, formed of a metal, such as platinum, is formed on the piezoelectric layer 70. The piezoelectric layer 70 and the second electrode 80 are then simultaneously patterned to form the piezoelectric element 300.

If necessary, the piezoelectric element 300 may be post-annealed at a temperature in the range of 600° C. to 700° C. Post-annealing can provide a good interface between the piezoelectric layer 70 and the first electrode 60 or the second electrode 80 and improve the crystallinity of the piezoelectric layer 70.

EXAMPLES

The invention will be further described in the following examples. However, the invention is not limited to these examples.

Example 1

A silicon dioxide film having a thickness of 400 nm was formed on a (100)-oriented silicon substrate by thermal oxidation. A titanium film having a thickness of 40 nm was formed on the silicon dioxide film by RF sputtering and was then thermally oxidized to form a titanium oxide film. A platinum film having a thickness of 150 nm was formed on the titanium oxide film by ion sputtering and vapor deposition to form a (111)-oriented first electrode 60.

A piezoelectric layer was formed on the first electrode by spin coating in the following manner. First, solutions of bismuth 2-ethylhexanoate, lanthanum 2-ethylhexanoate, iron 2-ethylhexanoate, or manganese 2-ethylhexanoate in xylene and octane were mixed at a predetermined ratio to prepare a precursor solution. The precursor solution was dropped on the substrate on which the titanium oxide film and the first electrode were formed, and the substrate was rotated at 1500 rpm to form a piezoelectric precursor film (a coating step). The precursor solution was dried and degreased at 350° C. for 3 minutes (a drying and degreasing step). After the coating step and the drying and degreasing step were performed three times, sitering was performed by rapid thermal annealing (RTA) at 650° C. for 1 minute (a sitering step). The three cycles of the coating step and the drying and degreasing step and the single sitering step were performed four times (12 coating steps in total). Sitering by RTA at 650° C. for 10 minutes yielded a piezoelectric layer 70 having a thickness of 350 nm.

A platinum film having a thickness of 100 nm was formed by DC sputtering as a second electrode 80 on the piezoelectric layer 70. Sitering by RTA at 650° C. for 10 minutes yielded a piezoelectric element 300. The piezoelectric element 300 included the piezoelectric layer 70 formed of an $ABO_3$ complex oxide having the general formula (1) in which x=0.21 and y=0.03.

Examples 2 to 11 and Comparative Examples 1 to 6

Piezoelectric elements 300 were formed in the same way as in Example 1 except that solutions of bismuth 2-ethylhexanoate, lanthanum 2-ethylhexanoate, iron 2-ethylhexanoate, or manganese 2-ethylhexanoate in xylene and octane were mixed at different ratios to form piezoelectric layers 70 formed of complex oxides having the general formula (1) in which x and y were shown in Table 1.

TABLE 1

|  | x | y |
|---|---|---|
| Example 1 | 0.21 | 0.03 |
| Example 2 | 0.24 | 0.03 |
| Example 3 | 0.24 | 0.05 |
| Example 4 | 0.28 | 0.01 |
| Example 5 | 0.29 | 0.02 |
| Example 6 | 0.29 | 0.03 |
| Example 7 | 0.29 | 0.05 |
| Example 8 | 0.28 | 0.07 |
| Example 9 | 0.27 | 0.09 |
| Example 10 | 0.33 | 0.05 |
| Example 11 | 0.38 | 0.05 |
| Comparative Example 1 | 0.20 | 0.01 |
| Comparative Example 2 | 0.19 | 0.05 |
| Comparative Example 3 | 0.48 | 0.05 |
| Comparative Example 4 | 0.30 | 0.00 |
| Comparative Example 5 | 0.10 | 0.00 |
| Comparative Example 6 | 0.00 | 0.00 |

Test Example 1

The relationship between the amount of polarization (P) and voltage (V) for the piezoelectric elements 300 according to Examples 1 to 11 and Comparative Examples 1 to 6 was determined using a triangular wave at a frequency of 1 kHz in a ferroelectric test system "FCE-1A" manufactured by Toyo Co. using an electrode pattern of $\phi$=400 μm. FIGS. 4 to 17 show the results. Comparative Examples 4 to 6 had too much leakage to determine the relationship and could not be used as piezoelectric materials.

FIGS. 4 to 14 show that Examples 1 to 11 had a double hysteresis curve and had a positive polarization above a certain threshold voltage and a very low polarization at a voltage of zero. Thus, Examples 1 to 11 were materials that could undergo electric-field-induced phase transition, that is, antiferroelectric substances. Examples 1 to 11 are piezoelectric materials that can produce a large strain in an electric-field-induced phase transition region.

Examples 4 to 9 with 0.27≤x≤0.29 in the general formula (1) particularly had a consistent voltage at which electric-field-induced phase transition occurred. Examples 1 to 7 and Examples 10 and 11 with 0.01≤y≤0.05 in the general formula (1) had particularly high leakage resistance.

Comparative Examples 1 and 2, which had x and y outside the ranges of 0.21≤x≤0.38 and 0.01≤y≤0.09 in the general formula (1), were ferroelectric substances having a hysteresis including spontaneous polarization characteristic of a ferroelectric substance. Comparative Example 3 was a paraelectric material. Comparative Examples 4 to 6 could not be used as a piezoelectric material because of excessive leakage, as described above. Thus, all of these Comparative Examples were not an antiferroelectric substance that could undergo electric-field-induced phase transition.

Test Example 2

The X-ray diffraction patterns of the piezoelectric elements 300 according to Examples 1 to 11 and Comparative Examples 1 to 6 were measured at room temperature with an X-ray diffractometer "D8 Discover" manufactured by Bruker AXS using a CuKα line as an X-ray source. An ABO$_3$ peak, a Pt (111) peak, and a Pt (111) CuKβ peak were observed in all of Examples 1 to 11 and Comparative Examples 1 to 6.

Figure 18:
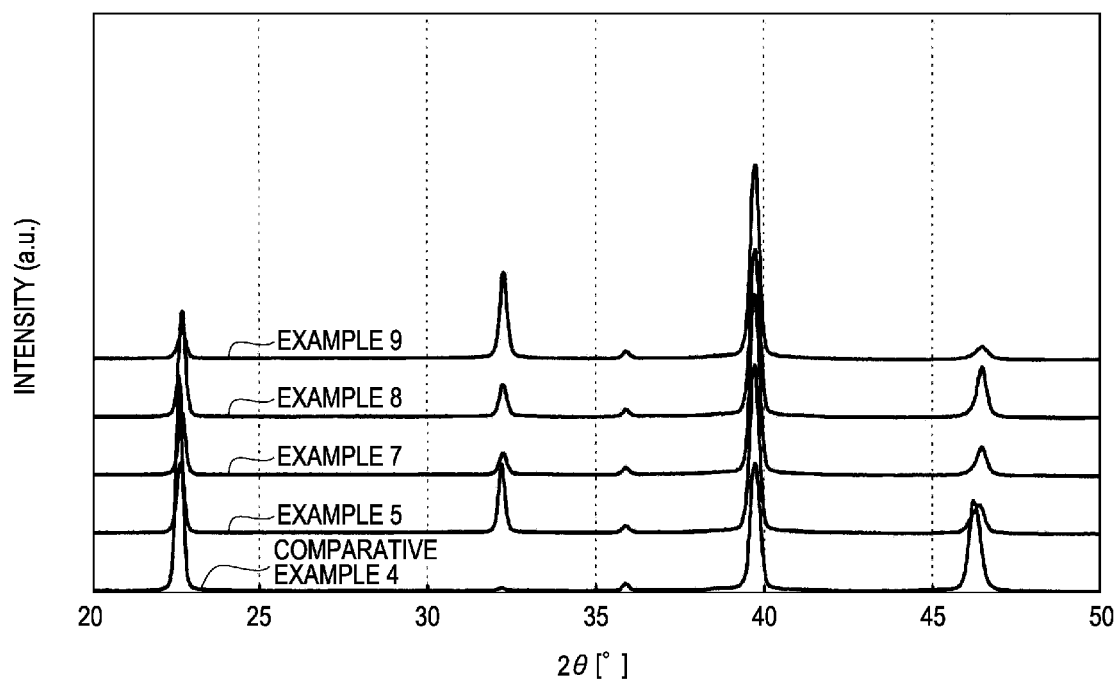
FIG. 18 is a graph showing an X-ray diffraction pattern according to Test Example 2.
Figure 19:
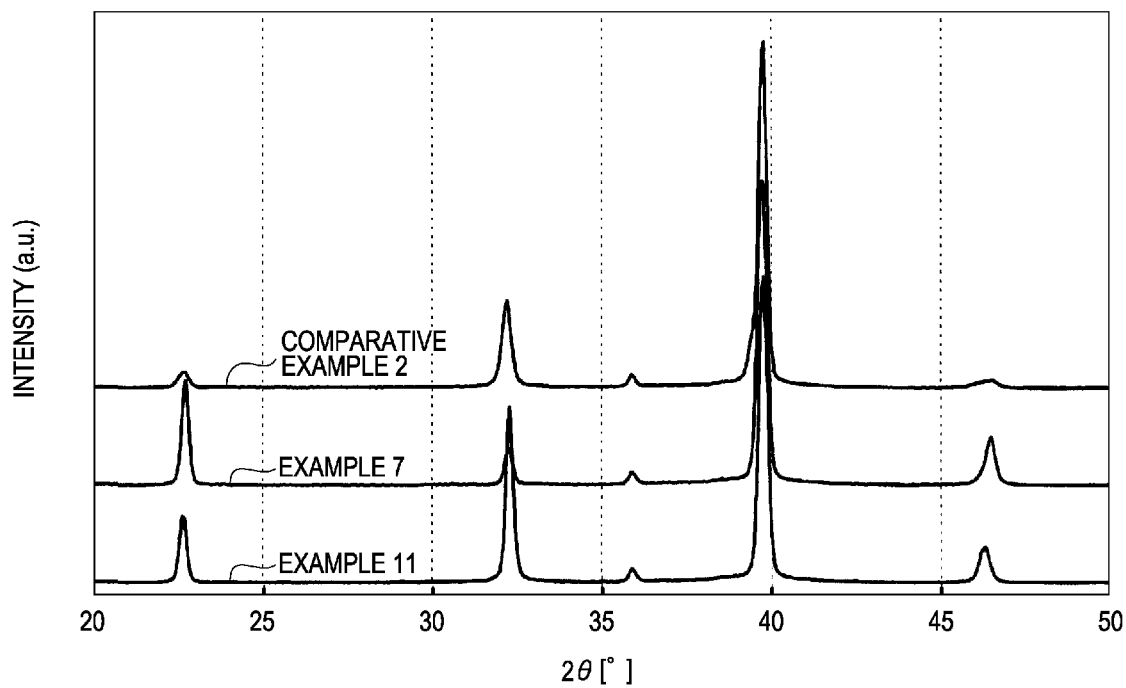
FIG. 19 is a graph showing an X-ray diffraction pattern according to Test Example 2.

This result shows that the piezoelectric layers of Examples 1 to 11 and Comparative Examples 1 to 6 had an ABO$_3$ structure. FIG. 18 shows the X-ray diffraction patterns of Examples 5, 7, 8, and 9 and Comparative Example 4, showing the diffraction intensity as a function of diffraction angle 2θ. FIG. 19 shows the X-ray diffraction patterns of Examples 7 and 11 and Comparative Example 2.

Test Example 3

Figure 20:
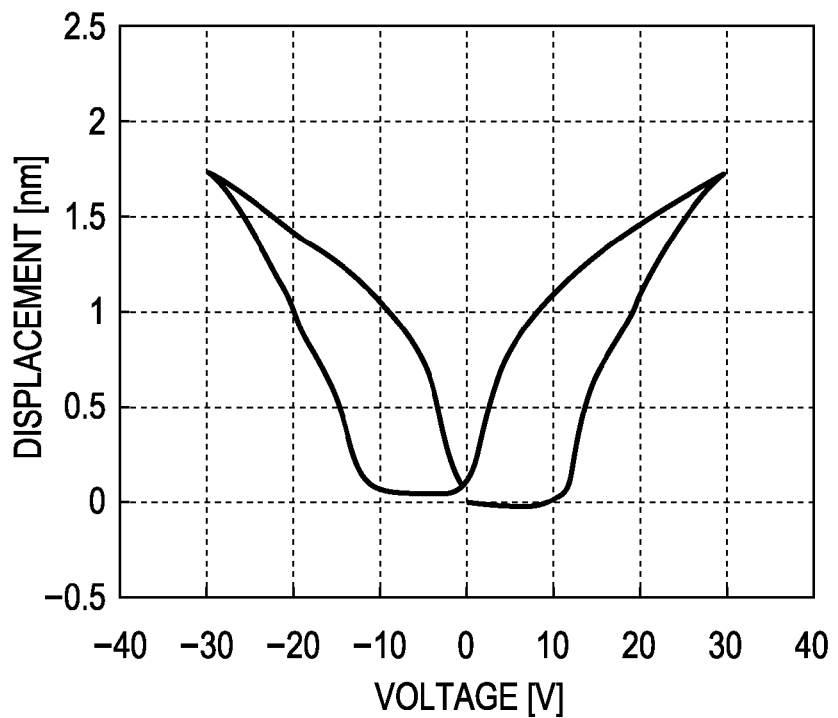
FIG. 20 is a graph showing an S-V curve according to Example 7.
Figure 21:
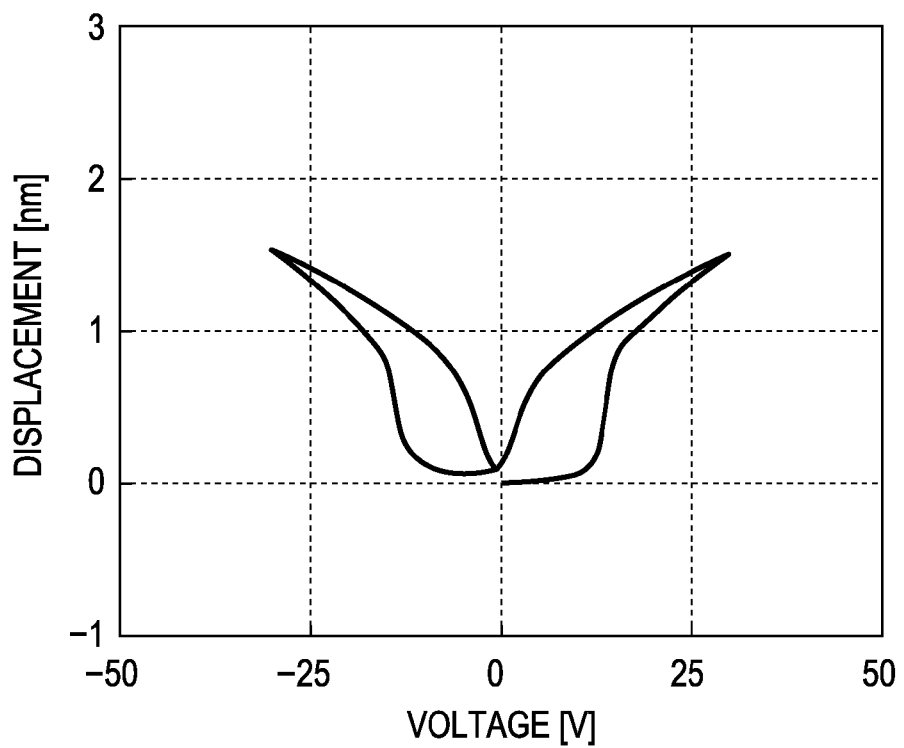
FIG. 21 is a graph showing an S-V curve according to Example 6.
Figure 22:
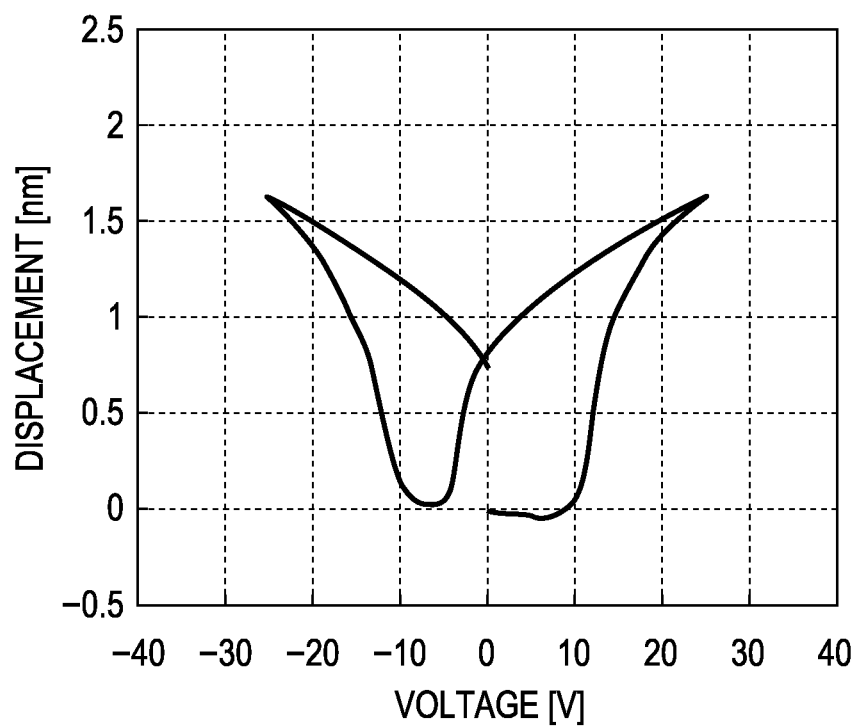
FIG. 22 is a graph showing an S-V curve according to Example 3.

The relationship between electric-field-induced strain (S) and voltage (V) in a direction (33 direction) parallel to the voltage direction for the piezoelectric elements 300 according to Examples 1 to 11 was determined at room temperature with a double-beam laser interferometer (DBLI) manufactured by aixACCT Systems using an electrode pattern of $\phi$=500 μm at a frequency of 1 kHz. Like the P-V hystereses shown in FIGS. 4 to 14, all of Examples 1 to 11 produced a large strain rate above a threshold voltage, producing a piezoelectric strain as large as 0.3% or more at 30V. FIGS. 20 to 22 show the results for Examples 7, 6, and 3.

The second electrode 80, which is the individual electrode of the piezoelectric element 300, is connected to a lead electrode 90. The lead electrode 90 may be formed of gold (Au) and extends from the neighborhood of an end of the ink feed channel 14 to the insulator film 55.

A protective substrate 30 having a reservoir portion 31, which constitutes at least part of a reservoir 100, is attached with an adhesive 35 to the flow-passage-forming substrate 10 on which the piezoelectric elements 300 are formed, that is, to the first electrode 60, the insulator film 55, and the lead electrode 90. The reservoir portion 31 is formed through the protective substrate 30 in the thickness direction and extends in the width direction of the pressure-generating chambers 12. As described above, the reservoir portion 31 communicates with the communication portion 13 in the flow-passage-forming substrate 10, constituting the reservoir 100. The reservoir 100 serves as a common ink chamber for the pressure-generating chambers 12. The communication portion 13 in the flow-passage-forming substrate 10 may be divided so as to correspond to each of the pressure-generating chambers 12, and only the reservoir portion 31 may function as a reservoir. Furthermore, for example, the flow-passage-forming substrate 10 may only include the pressure-generating chambers 12, and members between the flow-passage-forming substrate 10 and the protective substrate 30 (for example, the elastic film 50, the insulator film 55, and the like) may include ink feed channels 14 to connect the reservoir with the pressure-generating chambers 12.

A region of the protective substrate 30 opposite the piezoelectric elements 300 includes a piezoelectric-element-holding portion 32, which has a space so as not to prevent the displacement of the piezoelectric elements 300. As long as the piezoelectric-element-holding portion 32 has a space so as not to prevent the displacement of the piezoelectric elements 300, the space may be sealed or not.

The protective substrate 30 is preferably formed of a material having substantially the same thermal expansion coefficient as the flow-passage-forming substrate 10, for example, a glass or ceramic material. In the present embodiment, the protective substrate 30 is formed of a silicon single crystal, which is the same material as the flow-passage-forming substrate 10.

The protective substrate 30 includes a through-hole 33 passing through the protective substrate 30 in the thickness direction. The neighborhoods of the ends of the lead electrodes 90 extending from the piezoelectric elements 300 are exposed in the through-hole 33.

A drive circuit 120 for driving the piezoelectric elements 300 juxtaposed to each other is fixed onto the protective substrate 30. The drive circuit 120 may be a circuit board or a semiconductor integrated circuit (IC). The drive circuit 120 is electrically connected to the lead electrodes 90 via interconnecting wiring 121 using electroconductive wires, such as bonding wires.

The protective substrate 30 is attached to a compliance substrate 40. The compliance substrate 40 includes a sealing film 41 and a fixing sheet 42. The sealing film 41 is formed of a flexible material and seals one side of the reservoir portion 31. The fixing sheet 42 is formed of a relatively hard material. The fixing sheet 42 has an opening 43 on top of the reservoir 100. Thus, one side of the reservoir 100 is sealed with the flexible sealing film 41 alone.

In the ink jet print head I according to the present embodiment, the reservoir 100 to the nozzle openings 21 are filled with ink supplied from an ink inlet connected to an external ink supply unit (not shown). A voltage is applied between the first electrode 60 and the second electrode 80 on the corresponding pressure-generating chamber 12 in response to a print signal from the drive circuit 120 to deform the elastic film 50, the insulator film 55, the first electrode 60, and the piezoelectric layer 70. The deformation increases the internal pressure of the pressure-generating chamber 12, allowing ink droplets to be discharged from the corresponding nozzle opening 21.

Figure 23:
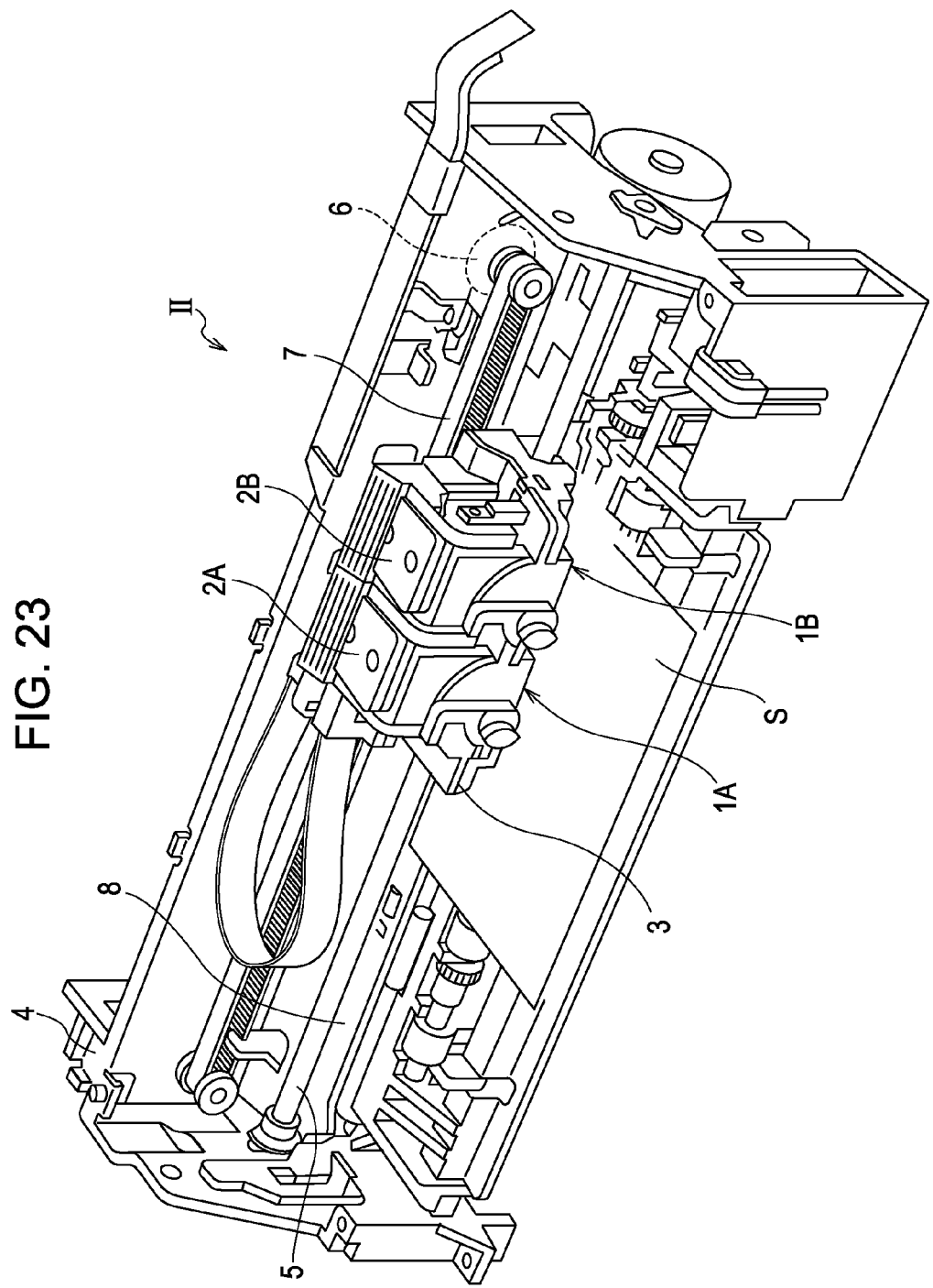
FIG. 23 is a schematic view of a printer according to a first embodiment of the invention.

The ink jet print head can be installed in an ink jet printer as one component of a print head unit that includes an ink path in communication with an ink cartridge. FIG. 23 is a schematic view of an ink jet printer according to an embodiment of the invention.

In an ink jet printer II illustrated in FIG. 23, print head units 1A and 1B include the ink jet print head I and house removable cartridges 2A and 2B. The cartridges 2A and 2B constitute an ink supply unit. A carriage 3 includes the print head units 1A and 1B and is mounted on a carriage shaft 5 attached to a main body 4 of the printer. The carriage 3 can move in the axial direction. For example, the print head units 1A and 1B discharge a black ink composition and a color ink composition, respectively.

When the driving force of a drive motor 6 is transferred to the carriage 3 via a plurality of gears (not shown) and a timing belt 7, the carriage 3 including the recording head units 1A and 1B is moved along the carriage shaft 5. The main body 4 of the printer includes a platen 8 along the carriage shaft 5. A recording sheet S, which is a recording medium, such as paper, can be fed by a feed roller (not shown) and transported over the platen 8.

A piezoelectric material that can undergo electric-field-induced phase transition (antiferroelectric substance) of the piezoelectric layer 70 in the ink jet printer behaves differently from a ferroelectric substance. Thus, in order to drive the ink jet printer at a desired amplitude, the ink jet printer requires a drive unit for sending a drive signal different from the drive signal for a conventional ferroelectric substance to the piezoelectric element. This will be further described below for the piezoelectric element 300 according to Example 6.

Figure 24:
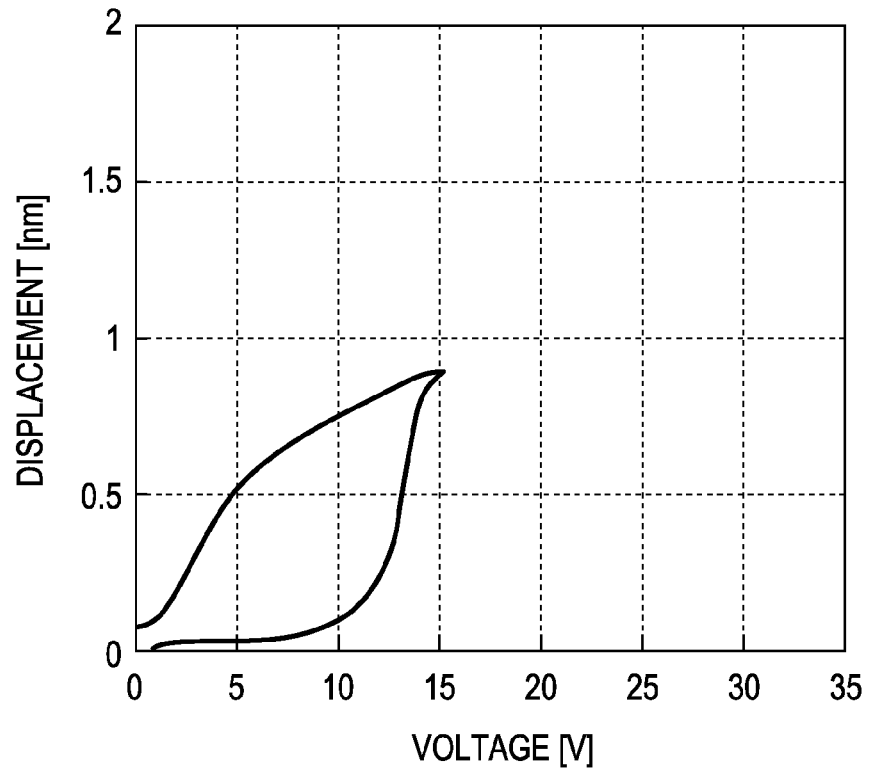
FIG. 24 is a graph showing an S-V curve according to Example 6 at 15 V.
Figure 25:
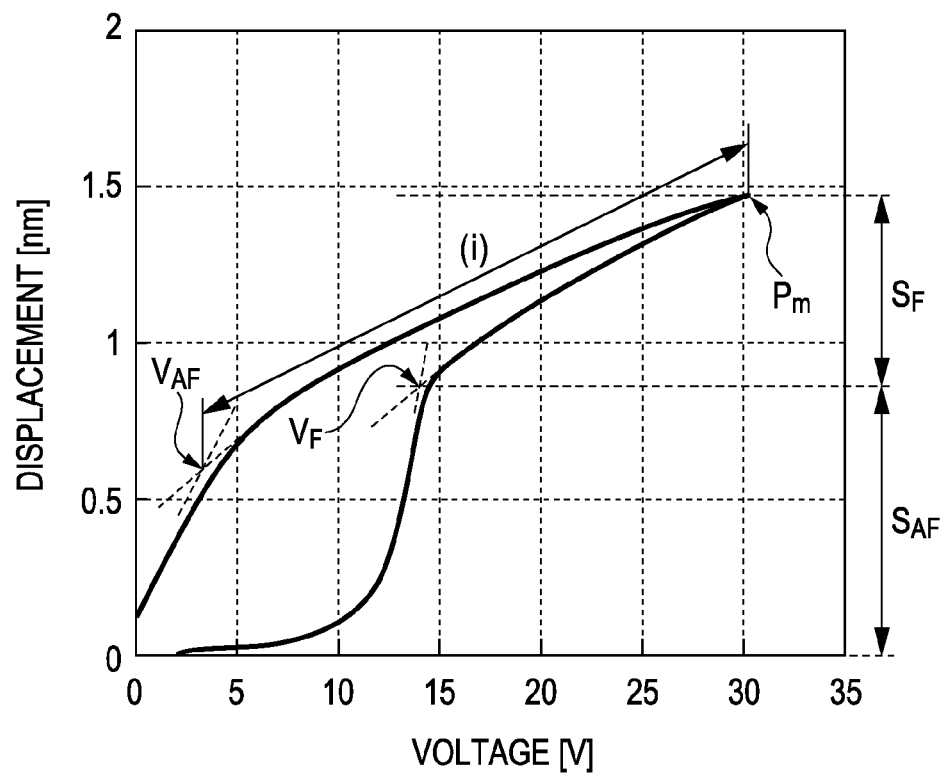
FIG. 25 is a graph showing an S-V curve according to Example 6 at 30 V.
Figure 26:
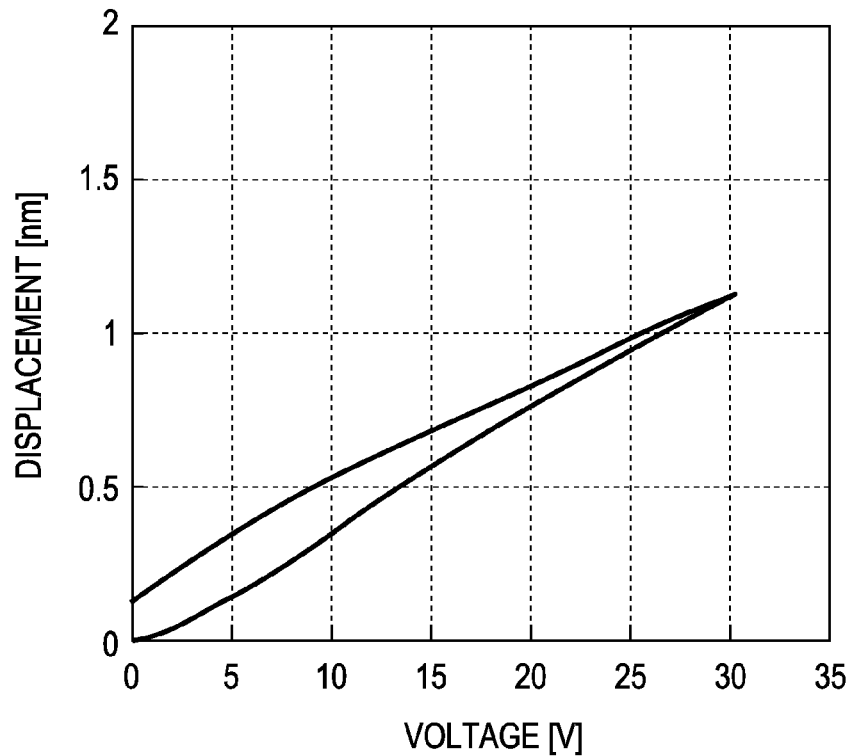
FIG. 26 is a graph showing an S-V curve of a ferroelectric substance at 30 V.

FIGS. 24 and 25 show electric-field-induced strain-voltage plots for Example 6 measured with a DBLI in a unipolar mode at a voltage of 15 and 30 V, respectively. FIG. 26 shows an electric-field-induced strain-voltage plot for a ferroelectric substance at a voltage of 30 V. As shown in FIG. 26, the electric-field-induced strain increases substantially linearly with voltage in the ferroelectric substance. In contrast, with the antiferroelectric substance of Example 6 shown in FIG. 24, upon the application of a 15-V triangular wave, a nonlinear electric-field-induced strain was observed between 10 and 15 V, resulting in a displacement of 0.89 nm. This corresponds to a strain rate as large as 0.26%. This strain results from electric-field-induced phase transition from an antiferroelectric phase to a ferroelectric phase. As shown in FIG. 25, upon the application of a 30-V triangular wave, in addition to the strain resulting from the electric-field-induced phase transition, it was found that the electric-field-induced strain increased substantially linearly with voltage between 15 and 30 V. This strain results from an inverse piezoelectric effect of the ferroelectric substance. The displacement due to the strain resulting from the electric-field-induced phase transition and the inverse piezoelectric effect was 1.47 nm at 30 V. This corresponds to a strain rate as large as 0.43%. As shown in FIG. 25, the strain resulting from the electric-field-induced phase transition is hereinafter referred to as $S_{AF}$, and the strain resulting from the inverse piezoelectric effect is hereinafter referred to as $S_F$.

As shown in FIGS. 24 and 25, because the electric-field-induced phase transition from an antiferroelectric phase to a ferroelectric phase is a first-order phase transition, the displacement has a hysteresis for the electric field. In FIG. 25, the voltages at points of intersection of lines extrapolated from the strain curves are hereinafter referred to as $V_F$ and $V_{AF}$. $V_F$ has a higher absolute value than $V_{AF}$. The strain resulting from the inverse piezoelectric effect is observed between $V_F$ and $V_{AF}$.

Figure 27:
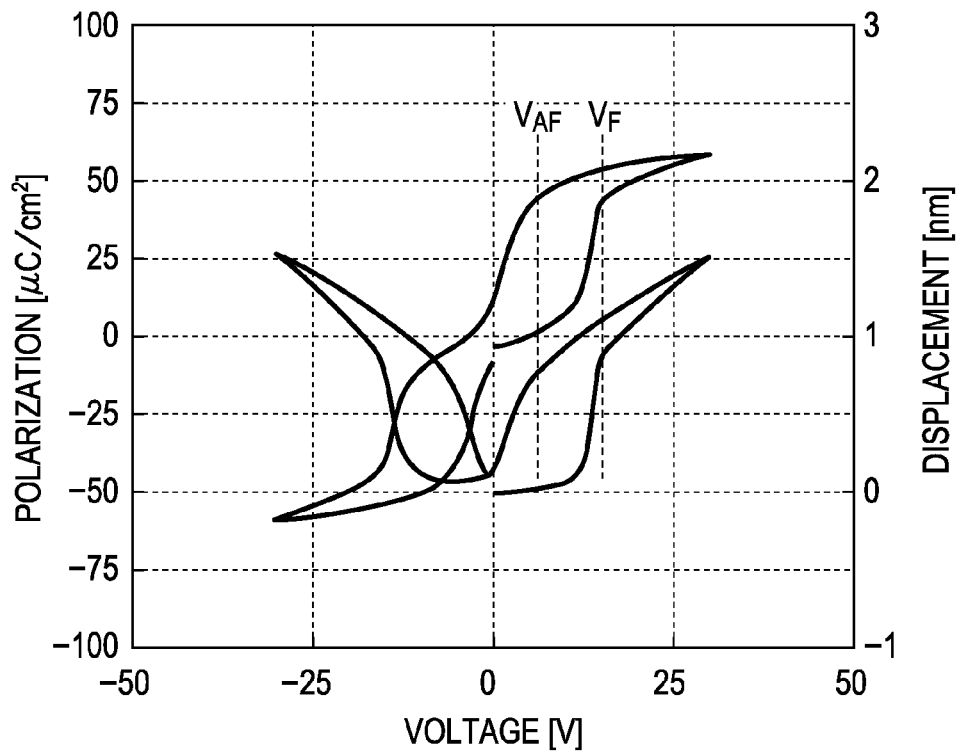
FIG. 27 is a graph showing a P-V curve and an S-V curve according to Example 6.
Figure 28:
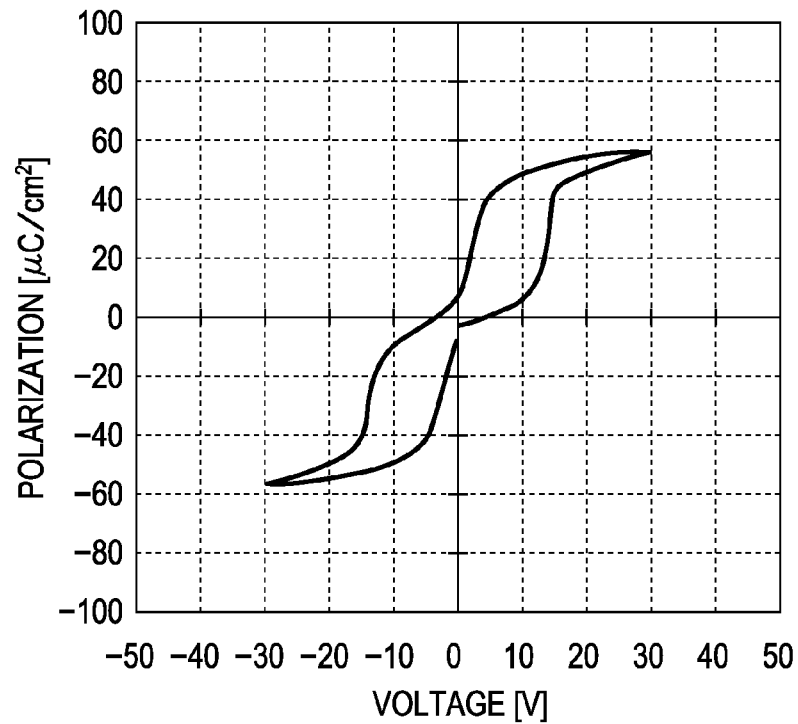
FIG. 28 is a graph showing the frequency tracking capability according to Example 6 (1 kHz).
Figure 29:
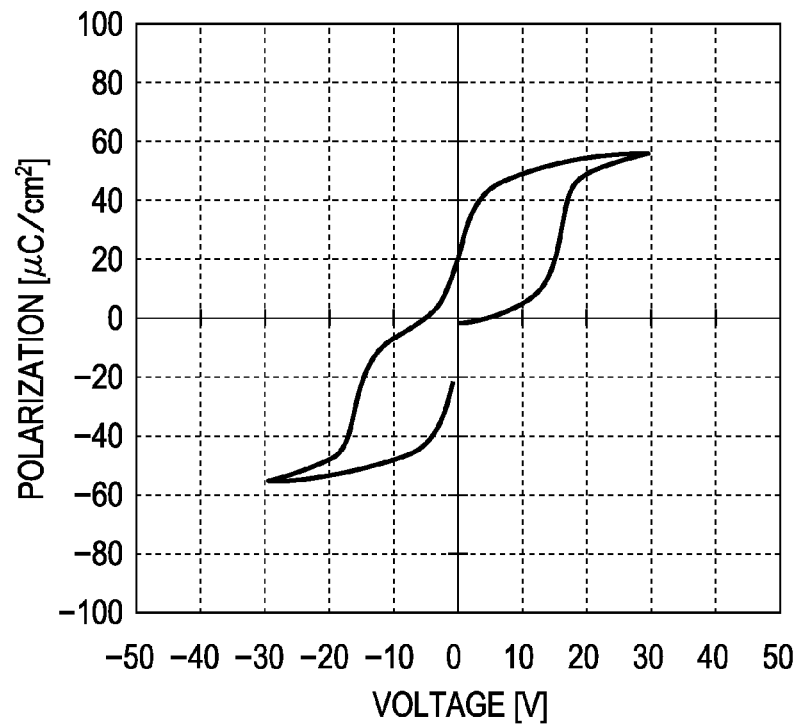
FIG. 29 is a graph showing the frequency tracking capability according to Example 6 (10 kHz).
Figure 30:
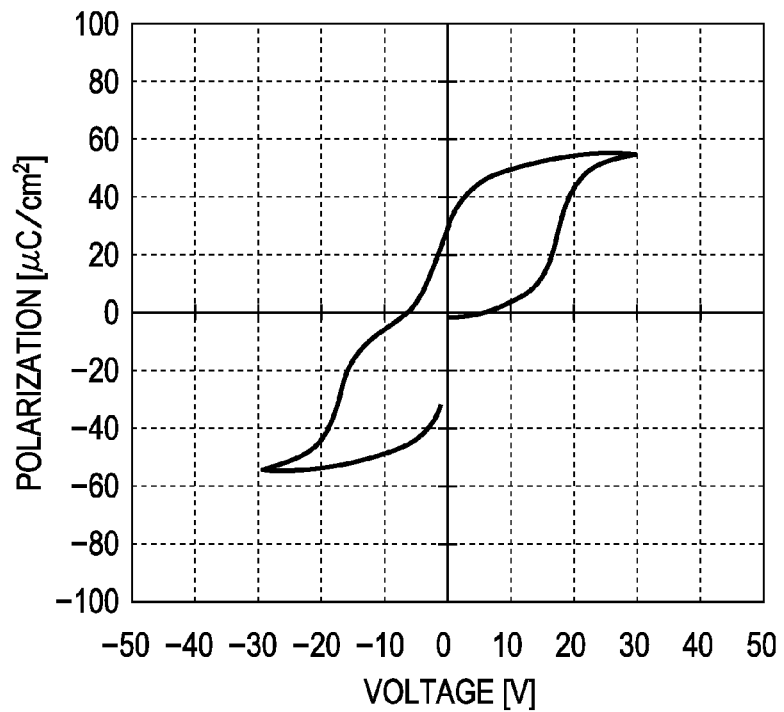
FIG. 30 is a graph showing the frequency tracking capability according to Example 6 (20 kHz).
Figure 31:
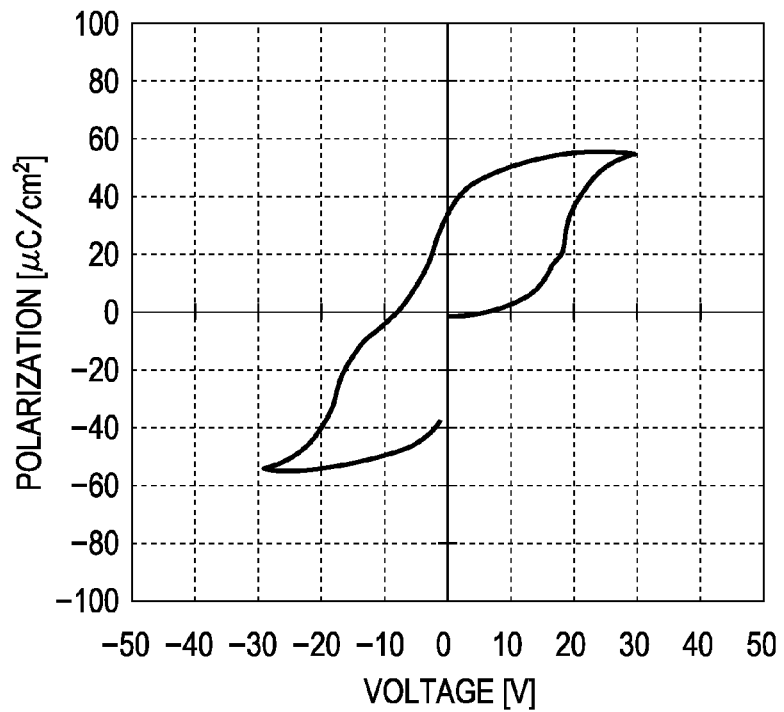
FIG. 31 is a graph showing the frequency tracking capability according to Example 6 (30 kHz).
Figure 32:
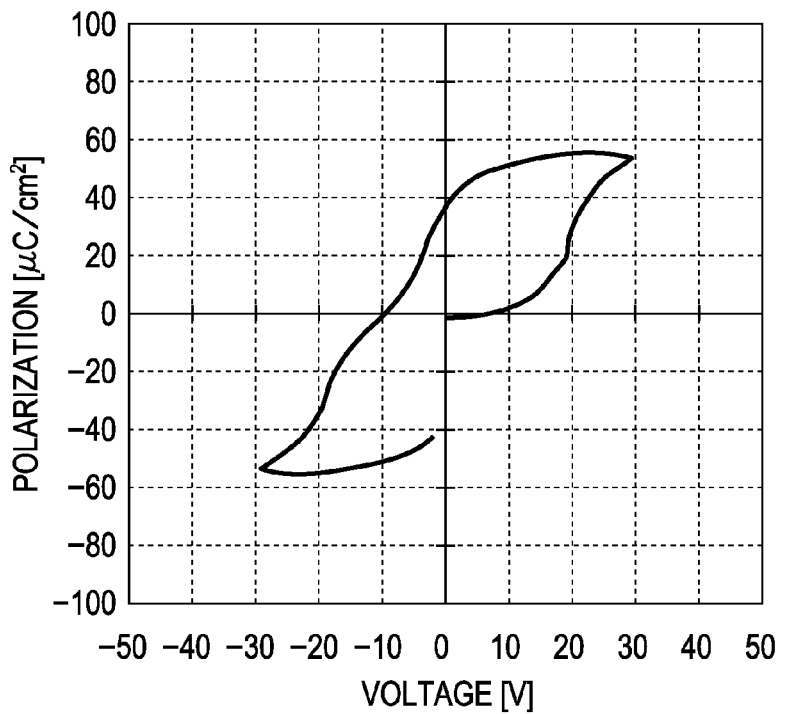
FIG. 32 is a graph showing the frequency tracking capability according to Example 6 (40 kHz).
Figure 33:
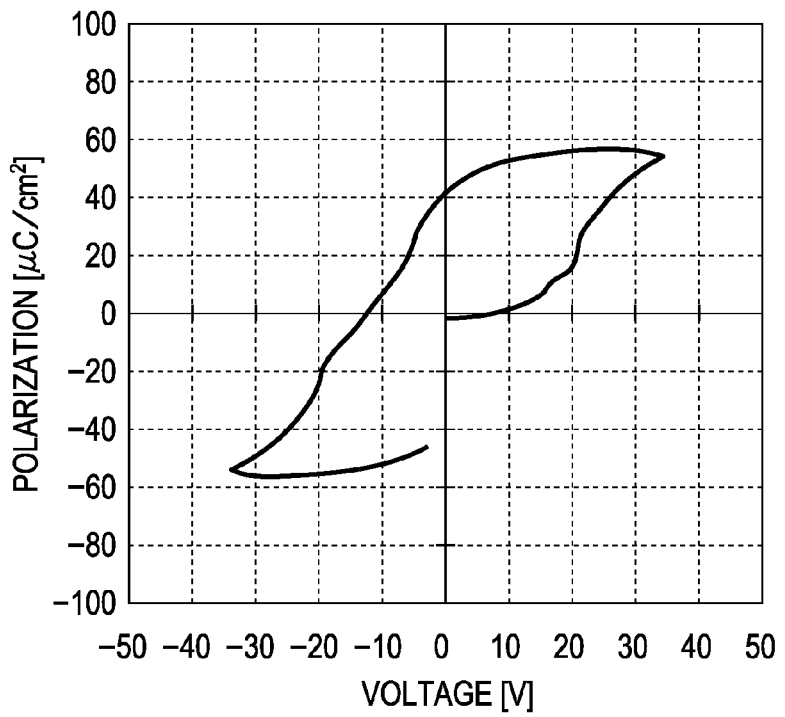
FIG. 33 is a graph showing the frequency tracking capability according to Example 6 (50 kHz).

FIG. 27 shows a P-V curve and an S-V plot according to Example 6. $V_F$ and $V_{AF}$ correspond to the inflection points of electric charge in the P-V curve. Thus, in the investigation of the drive waveform, the pattern of electric-field-induced strain produced by the application of a voltage can be estimated from the measurement of electric charge.

The frequency tracking capability in the P-V curve was measured with TFA2000HS manufactured by aixACCT Systems using an electrode pattern of $\phi$=500 μm at 1, 10, 20, 30, 40, and 50 kHz. As shown in FIGS. 28 to 33, double hysteresis P-V curves characteristic of an antiferroelectric substance were observed at all the frequencies between 1 and 50 kHz. In comparison among FIGS. 28 to 33, the hysteresis seems to increase with frequency. This is due to the measuring apparatus and not due to the material. Thus, the antiferroelectric piezoelectric materials (Examples) can be tracked up to a frequency of at least 50 kHz.

Figure 34:
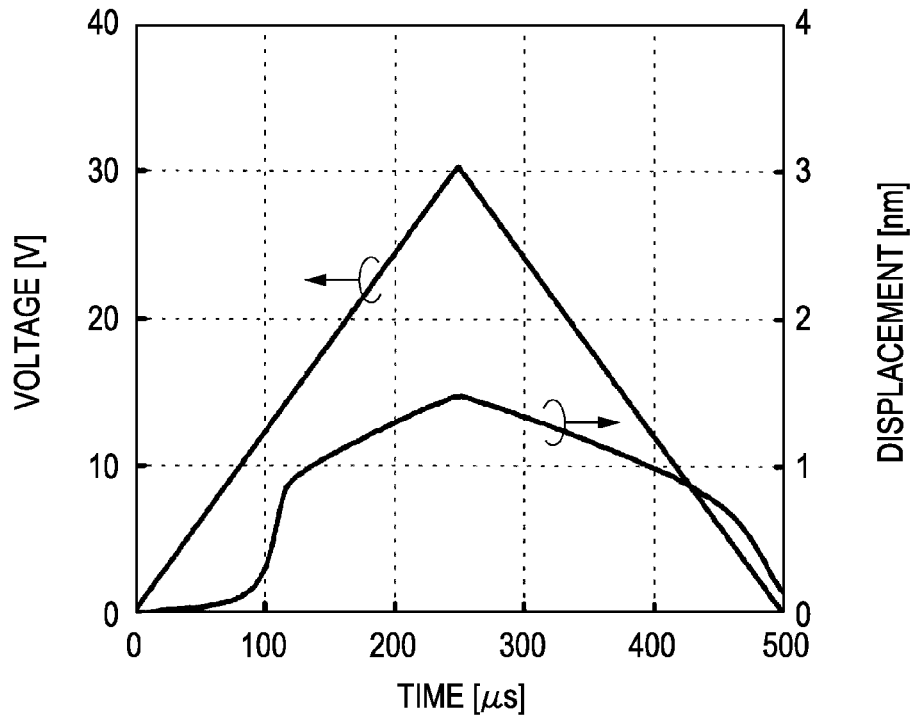
FIG. 34 shows a voltage-time plot and an electric-field-induced strain-time plot of an antiferroelectric substance at 30 V.
Figure 35:
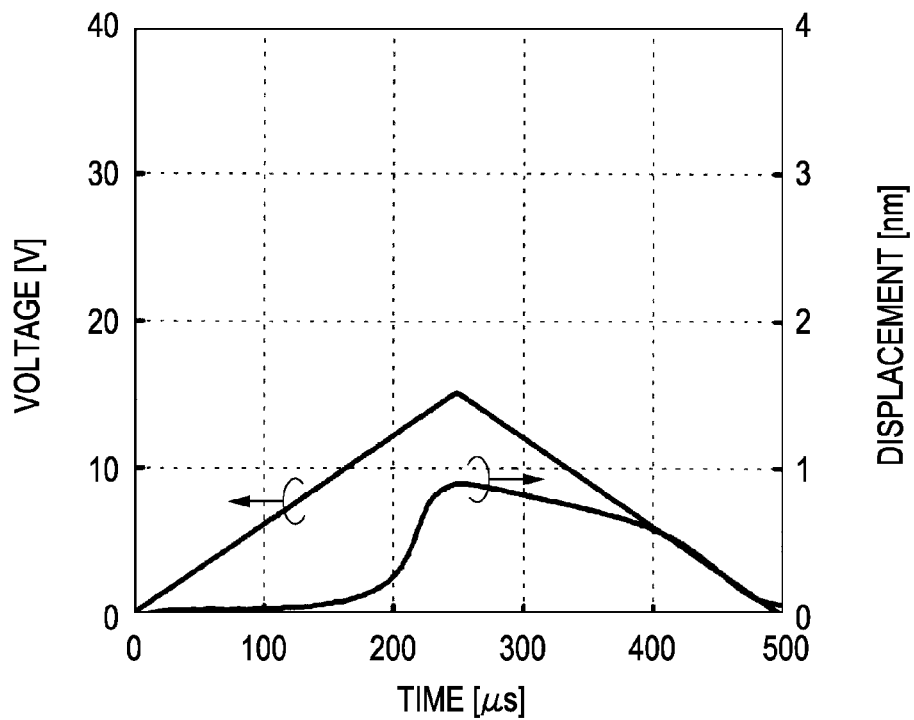
FIG. 35 shows a voltage-time plot and an electric-field-induced strain-time plot of an antiferroelectric substance at 15 V.
Figure 36:
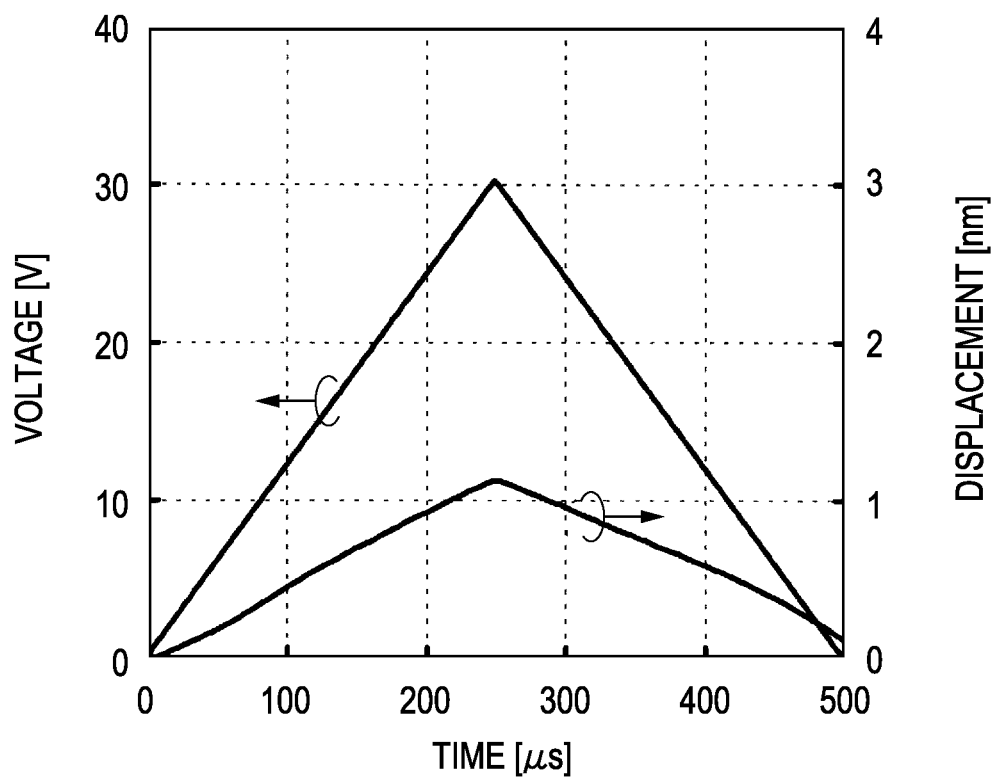
FIG. 36 shows a voltage-time plot and an electric-field-induced strain-time plot of a ferroelectric substance at 30 V.

FIGS. 34 and 35 show voltage and displacement as a function of time for an antiferroelectric substance, such as Example 6, at a voltage of 30 and 15 V, respectively. FIG. 36 shows voltage and displacement as a function of time for a ferroelectric substance at a voltage of 30 V. With the ferroelectric substance, the voltage-time plot has a shape similar to the shape of the electric-field-induced strain-time plot. The antiferroelectric substance has a different voltage-time plot from the ferroelectric substance, as shown in FIG. 34. When a voltage sufficiently higher than $V_F$ is applied, the electric-field-induced strain-time plot has inflection points. The inflection points correspond to $V_F$ and $V_{AF}$ in the electric-field-induced strain-voltage plot. A steep rising in a low electric field side corresponds to $S_{AF}$, and a straight line in a high electric field side corresponds to $S_F$. In FIG. 35 in which the voltage was below $V_F$, only a strain $S_{AF}$ was observed when the voltage was increased, and both $S_F$ and $S_{AF}$ were observed when the voltage was decreased.

As described above, the piezoelectricity in response to voltage of the antiferroelectric substance is different from that of the ferroelectric substance. A waveform optimized for the antiferroelectric substance must therefore be used to drive the piezoelectric element.

Figure 37:
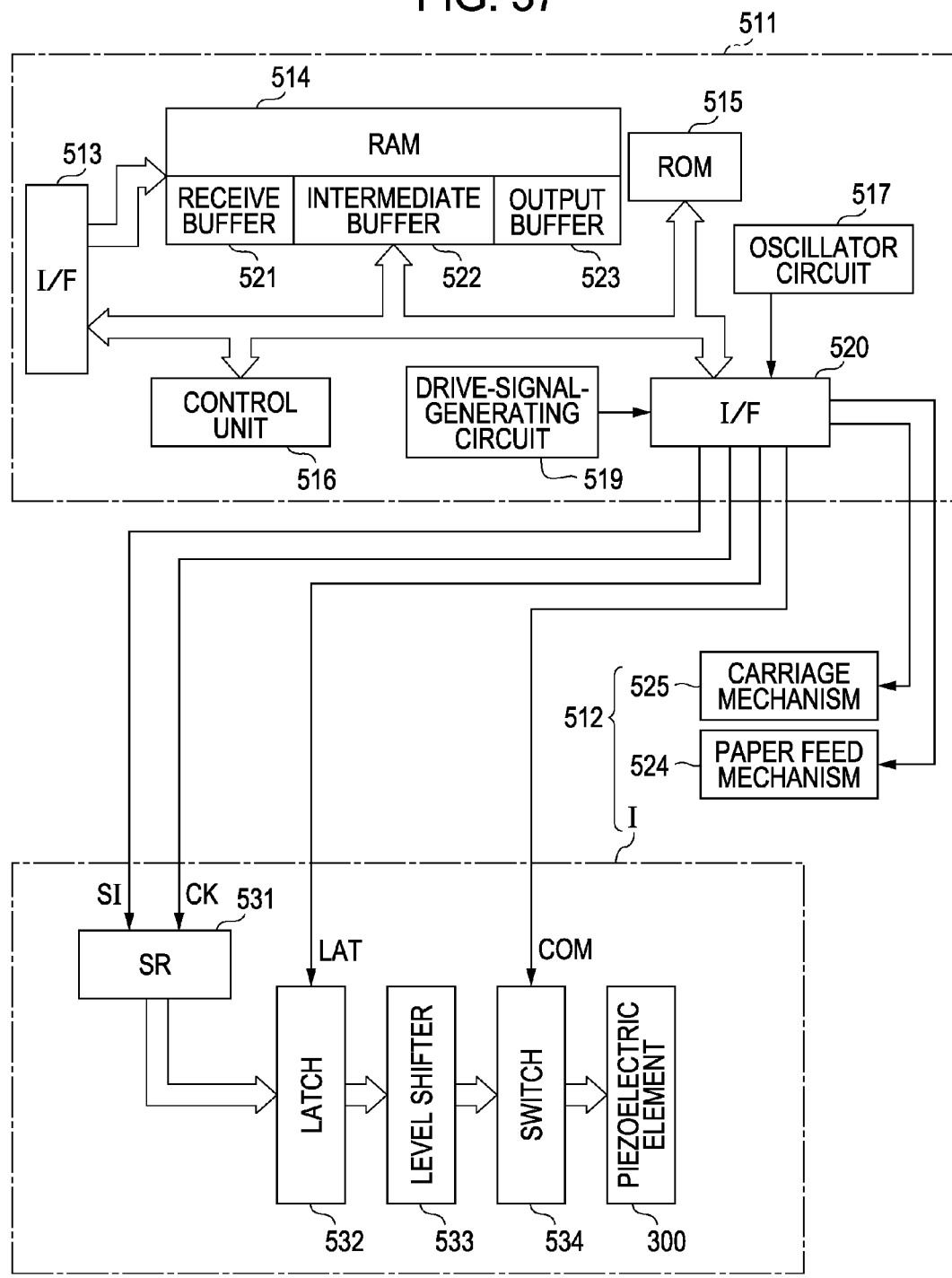
FIG. 37 is a block diagram of a control mechanism for an ink jet printer.

FIG. 37 is a block diagram of a control mechanism for an ink jet printer. The control of an ink jet printer according to the present embodiment will be described below with reference to FIG. 37. The ink jet printer according to the present embodiment includes a printer controller 511 and a print engine 512. The printer controller 511 includes an external interface 513 (hereinafter referred to as an external I/F 513), a RAM 514 for temporarily storing various data, a ROM 515 for storing a control program, a control unit 516 including a CPU, an oscillator circuit 517 for generating a clock signal, a drive-signal-generating circuit 519 for generating a drive signal to be sent to an ink jet print head I, and an internal interface 520 (hereinafter referred to as an internal I/F 520) for sending a drive signal and dot pattern data (bitmap data) developed based on print data to the print engine 512.

The external I/F 513 receives print data, for example, composed of character codes, a graphic function, and image data from a host computer (not shown). A busy signal (BUSY) and an acknowledge signal (ACK) are output to the host computer through the external I/F 513. The RAM 514 functions as a receive buffer 521, an intermediate buffer 522, an output buffer 523, and a working memory (not shown). The receive buffer 521 can temporarily store print data received by the external I/F 513. The intermediate buffer 522 can store intermediate code data converted by the control unit 516. The output buffer 523 can store dot pattern data. The dot pattern data are composed of print data obtained by decoding (translating) gradation data.

The ROM 515 stores a control program (control routine) for various data processing, font data, and a graphic function.

The control unit 516 can read print data from the receive buffer 521 and allows the intermediate code data converted from the print data to be stored in the intermediate buffer 522. The control unit 516 can analyze intermediate code data read from the intermediate buffer 522 and develop the intermediate code data into dot pattern data with reference to the font data and the graphic function stored in the ROM 515. After decoration processing required is completed, the control unit 516 allows the developed dot pattern data to be stored in the output buffer 523. The control unit 516 can also determine the waveform. More specifically, the control unit 516 can control the drive-signal-generating circuit 519 to determine the waveform of a drive signal generated by the drive-signal-generating circuit 519. The control unit 516 and a drive circuit (not shown) described below constitute a drive unit according to an embodiment of the invention. A liquid-ejecting drive for driving the ink jet print head I includes this drive unit. In the present embodiment, the liquid-ejecting drive includes the printer controller 511.

Dot pattern data corresponding to one line of characters is output to the ink jet print head I through the internal I/F 520. After the dot pattern data corresponding to one line of characters is output from the output buffer 523, the developed intermediate code data is deleted from the intermediate buffer 522, and the next intermediate code data is developed.

The print engine 512 includes the ink jet print head I, a paper feed mechanism 524, and a carriage mechanism 525. The paper feed mechanism 524 includes a paper feed motor and a platen 8 and successively feeds a print recording medium, such as recording paper, in synchronism with the print operation of the ink jet print head I. Thus, the paper feed mechanism 524 moves a print recording medium in the sub-scanning direction.

The carriage mechanism 525 includes a carriage 3 in which the ink jet print head I can be mounted and a carriage drive for driving the carriage 3 in the main scanning direction. The carriage mechanism 525 drives the carriage 3 to move the ink jet print head I in the main scanning direction. The carriage drive includes the drive motor 6 and the timing belt 7.

The ink jet print head I includes many nozzle openings 21 in the sub-scanning direction and discharges droplets from the nozzle openings 21 in accordance with the ejection timing defined by the dot pattern data. An electric signal, for example, a drive signal (COM) and print data (SI) described below are sent to the piezoelectric element 300 of the ink jet print head I through external wiring (not shown). In the printer controller 511 and the print engine 512, the printer controller 511 and a drive circuit (not shown) serve as a drive unit for sending a drive signal to the piezoelectric element 300. The drive circuit selectively inputs a drive signal having a certain drive waveform output from the drive-signal-generating circuit 519 to the piezoelectric element 300. The drive circuit includes a latch 532, a level shifter 533, and a switch 534.

The shift register (SR) 531, the latch 532, the level shifter 533, the switch 534, and the piezoelectric element 300 are provided for each of the nozzle openings 21 of the ink jet print head I. The shift register 531, the latch 532, the level shifter 533, and the switch 534 generate a drive pulse from a discharge drive signal or a relaxation drive signal generated by the drive-signal-generating circuit 519. The drive pulse is an actual pulse applied to the piezoelectric element 300.

In such an ink jet print head I, print data (SI) of the dot pattern data are first transmitted serially from the output buffer 523 to the shift register 531 in synchronism with a clock signal (CK) from the oscillator circuit 517 and are sequentially stored in the shift register 531. More specifically, after most significant bit data of print data for all the nozzle openings 21 are serially transmitted, second most significant bit data are serially transmitted. In this way, lower-order bit data are sequentially serially transmitted.

After bit data of the print data for all the nozzle openings are completely loaded into the shift register 531, the control unit 516 outputs latch signal (LAT) to the latch 532 in a predetermined timing. In response to the latch signal, the latch 532 latches the print data loaded into the shift register 531. The print data (LATout) latched by the latch 532 is applied to the level shifter 533 serving as a voltage amplifier. When the print data is "1", the level shifter 533 increases the print data to a voltage at which the switch 534 can be driven, for example, several tens of volts. This raised print data are applied to the switch 534 to activate the connection of the switch 534.

A drive signal (COM) generated by the drive-signal-generating circuit 519 has also been applied to the switch 534. Upon the selective connection of the switch 534, the drive signal is selectively applied to the piezoelectric element 300 connected to the switch 534. In the ink jet print head I, therefore, the application of a discharge drive signal to the piezoelectric element 300 depends on the print data. For example, when the print data is "1", the latch signal (LAT) activates the connection of the switch 534, allowing the drive signal (COMout) to be sent to the piezoelectric element 300. The drive signal (COMout) causes the displacement (deformation) of the piezoelectric element 300. When the print data is "0", the switch 534 is disconnected, thereby blocking the transmission of the drive signal to the piezoelectric element 300. While the print data is "0", the piezoelectric element 300 holds the last electric potential, maintaining the last displacement.

The piezoelectric element 300 is in a flexural vibration mode. In the piezoelectric element 300 in a flexural vibration mode, upon the application of a voltage, the piezoelectric layer 70 contracts in a direction (31 direction) perpendicular to the voltage direction. The piezoelectric element 300 and the diaphragm bend toward the pressure-generating chamber 12, thereby narrowing the pressure-generating chamber 12. A decrease in voltage causes the piezoelectric layer 70 to elongate in the 31 direction, bending the piezoelectric element 300 and the diaphragm away from the pressure-generating chamber 12, thereby expanding the pressure-generating chamber 12. In the ink jet print head I, charging and discharging the piezoelectric element 300 alter the volume of the pressure-generating chamber 12. A change in the internal pressure of the pressure-generating chamber 12 can therefore be used to discharge droplets from the nozzle opening 21.

Figure 38:
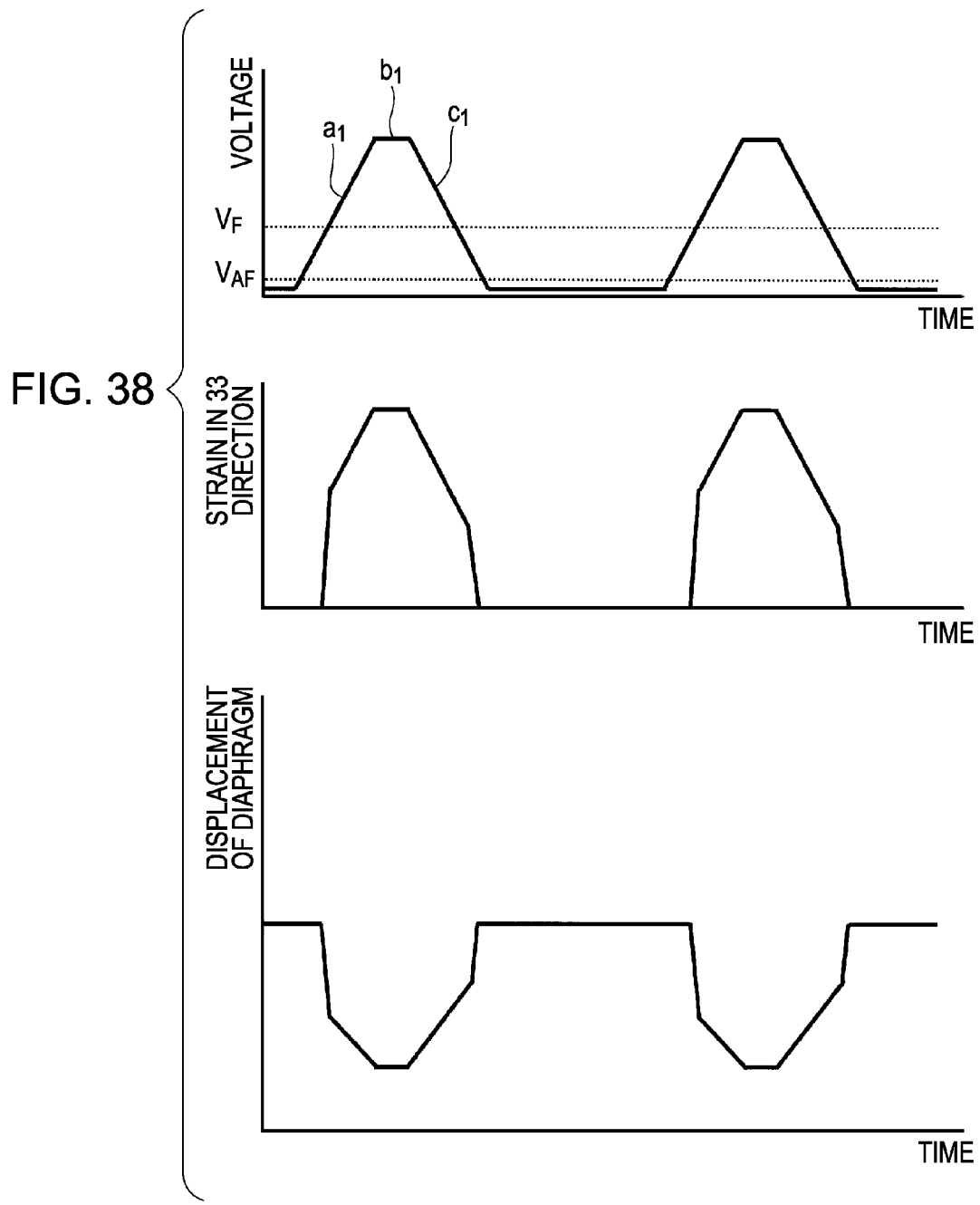
FIG. 38 shows graphs showing a displacement when a high voltage is applied to a piezoelectric element composed of an antiferroelectric substance.
Figure 39:
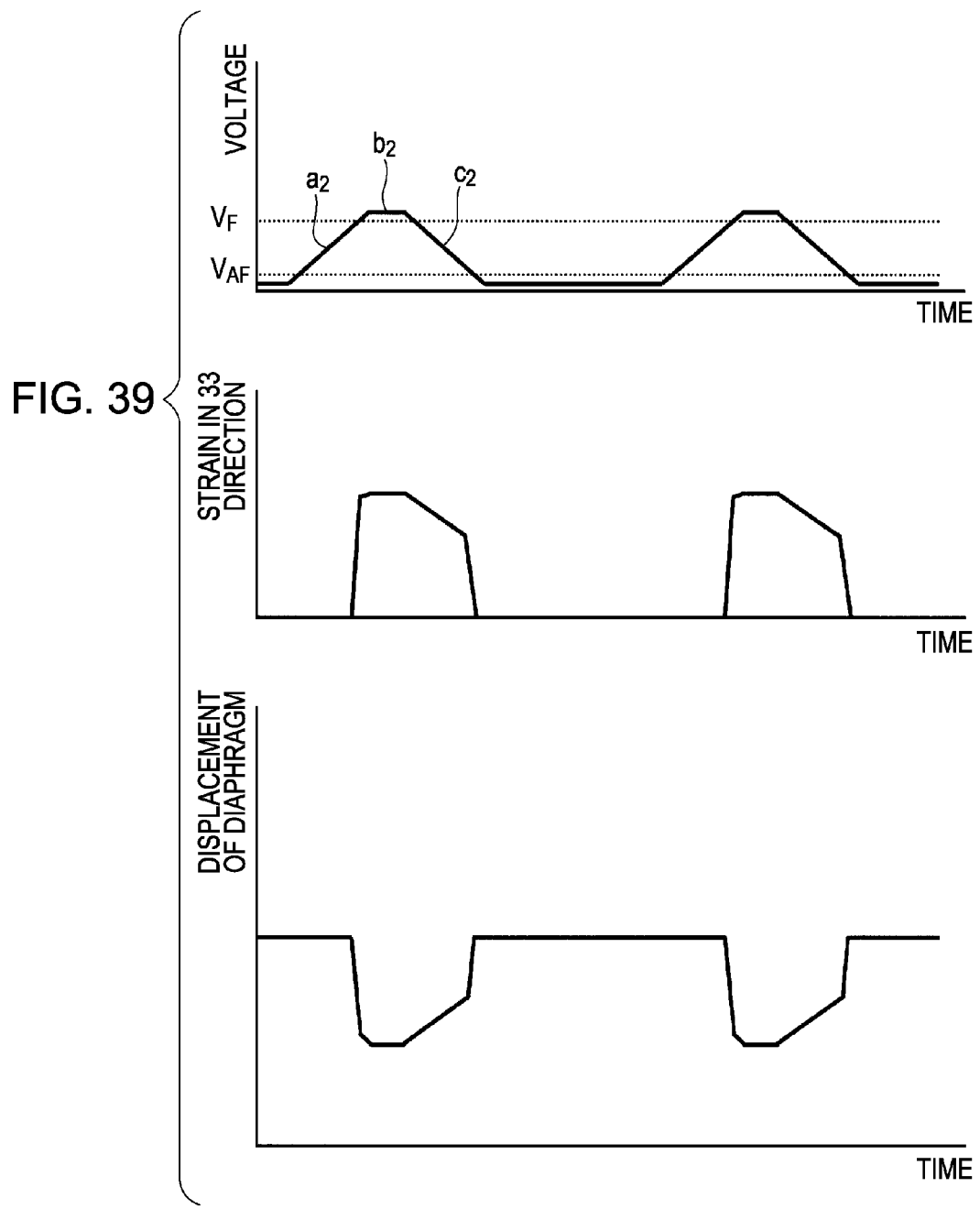
FIG. 39 shows graphs showing a displacement when a low voltage is applied to a piezoelectric element composed of an antiferroelectric substance.

The drive waveform of the drive signal (COM) input to the piezoelectric element 300 will be described below. The displacement in the 31 direction in the flexural vibration mode linearly correlates with the displacement in the 33 direction measured with a DBLI. More specifically, the displacement in the 33 direction multiplied by a negative constant can be closely related to flexural displacement. FIGS. 38 and 39 show the voltage, the electric-field-induced strain in the 33 direction, and the displacement of a diaphragm as a function of time. FIGS. 38 and 39 show the displacement of a diaphragm when the voltage applied to a piezoelectric element composed of an antiferroelectric substance is linearly increased from zero volts.

As shown in FIG. 38, in a voltage increase step $a_1$, the displacement in the 33 direction is zero at a voltage sufficiently lower than $V_F$ and increases sharply in a narrow voltage range around $V_F$ because of $S_{AF}$. The displacement increases monotonously with increasing voltage at a voltage higher than $V_F$ because of $S_F$. In a voltage decrease step $c_1$ after a holding step $b_1$, the displacement decreases monotonously with a decrease in voltage to $V_{AF}$ because of $S_F$ and decreases sharply in a narrow voltage range around $V_{AF}$ because of $S_{AF}$. The actual values in FIG. 34 correspond to FIG. 38 in which the starting voltage=0, the maximum voltage=30 V, the holding step $b_{1=250}$ μsec, and the minimum voltage=0. Correspondingly, in the voltage increase step $a_1$, the displacement of the diaphragm is zero at a voltage sufficiently lower than $V_F$ and increases sharply in a narrow voltage range around $V_F$ to narrow the pressure-generating chamber 12. The displacement of the diaphragm increases monotonously with voltage at a voltage higher than $V_F$, thereby narrowing the pressure-generating chamber 12. In the voltage decrease step $c_1$ after the holding step $b_1$, the displacement of the diaphragm decreases monotonously with a decrease in voltage to $V_{AF}$ to expand the pressure-generating chamber 12 and decreases sharply around $V_{AF}$ to expand the pressure-generating chamber 12.

As shown in FIG. 39, in a voltage increase step $a_2$, the displacement in the 33 direction is zero at a voltage sufficiently lower than $V_F$ and increases sharply in a narrow voltage range around $V_F$ because of $S_{AF}$. In a voltage decrease step $c_2$ after a holding step $b_2$, the displacement decreases monotonously with a decrease in voltage to $V_{AF}$ because of $S_F$ and decreases sharply in a narrow voltage range around $V_{AF}$ because of $S_{AF}$. The actual values in FIG. 35 correspond to FIG. 39 in which the starting voltage=0, the maximum voltage=15 V, the holding step $b_2$=250 μsec, and the minimum voltage=0. Correspondingly, in the voltage increase step $a_2$, the displacement of the diaphragm is zero at a voltage sufficiently lower than $V_F$ and increases sharply in a narrow voltage range around $V_F$ to narrow the pressure-generating chamber 12. In the voltage decrease step $c_2$ after the holding step $b_2$, the displacement of the diaphragm decreases monotonously with a decrease in voltage to $V_{AF}$ to expand the pressure-generating chamber 12 and decreases sharply around $V_{AF}$ to expand the pressure-generating chamber 12.

Thus, the antiferroelectric substance has both a ferroelectric phase region and an antiferroelectric phase region. In the ferroelectric phase region, the displacement increases or decreases monotonously with voltage (an inverse piezoelectric effect). In the antiferroelectric phase region, the displacement increases or decreases sharply in a narrow voltage range (electric-field-induced phase transition strain). With a drive signal used for a common ferroelectric substance, therefore, the antiferroelectric substance cannot be driven at a desired amplitude.

However, in a ferroelectric phase region, in which the displacement alters linearly, the voltage can be decreased to generate a small amplitude (microvibration). In other words, with a starting voltage passing $V_F$ and having an absolute value of $V_{AF}$ or more, a drive signal that alters the voltage in a region having an absolute value of $V_{AF}$ or more can be applied to a piezoelectric element to generate a small amplitude. More specifically, for example, a piezoelectric element can be driven in a region (i) in FIG. 25. In FIG. 25, $P_m$ denotes saturation polarization.

Figure 40:
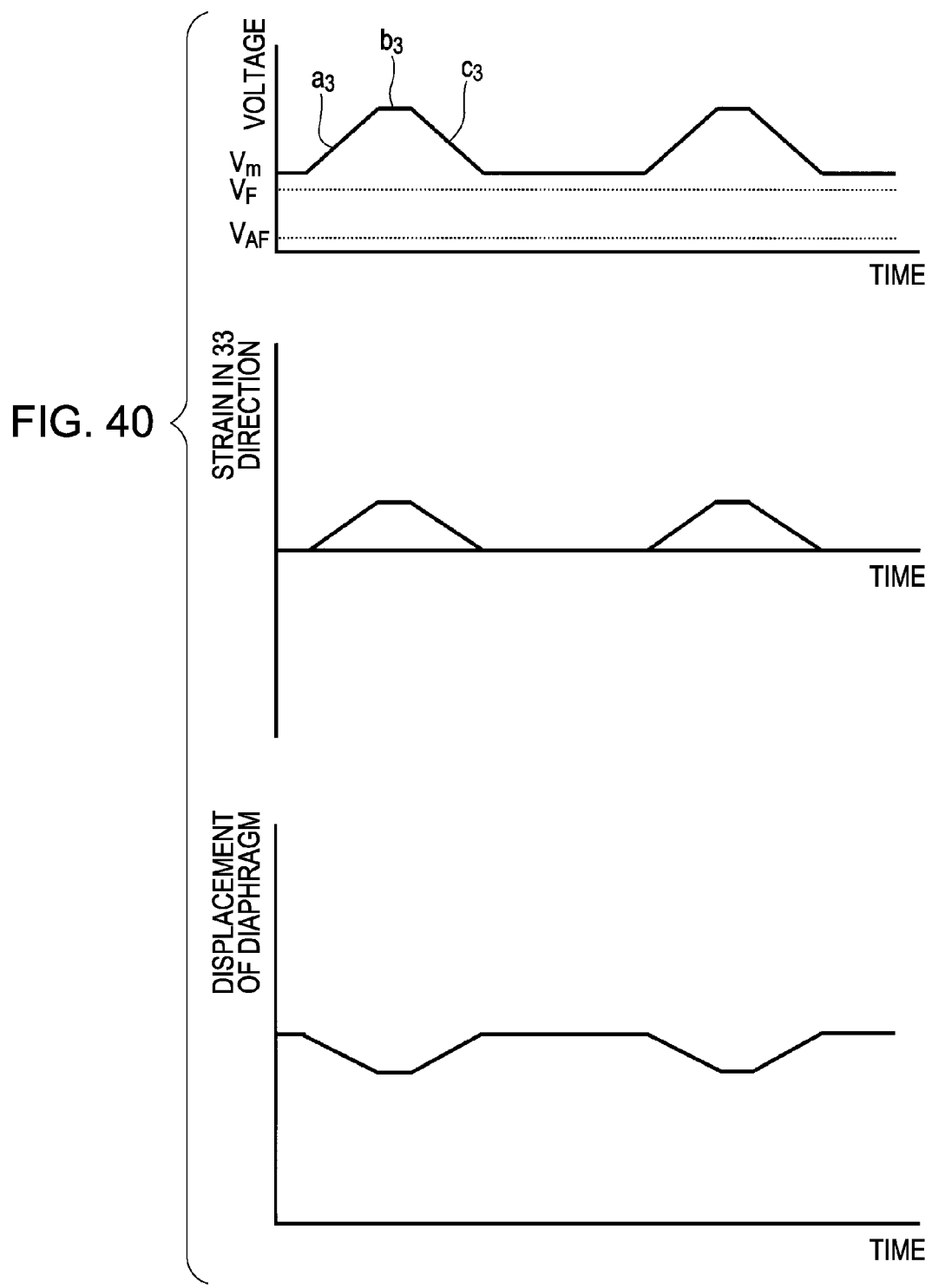
FIG. 40 shows graphs showing a drive waveform having a small amplitude.

FIG. 40 shows a specific example of a drive waveform having a small amplitude. After a voltage higher than $V_F$ is applied, a voltage is applied so as to maintain a predetermined voltage and is held above $V_F$, that is, in the region (i) in FIG. 25. A holding voltage $V_m$ is a starting voltage in FIG. 40. The starting voltage is higher than $V_F$. The voltage is increased in a contraction step $a_3$. In the contraction step $a_3$, the displacement increases linearly with voltage applied, thus discharging droplets. The voltage can therefore be decreased to generate a small amplitude. After a holding step $b_3$, the voltage is decreased to the holding voltage $V_m$ (a standby state) in an expansion step $c_3$.

Figure 41:
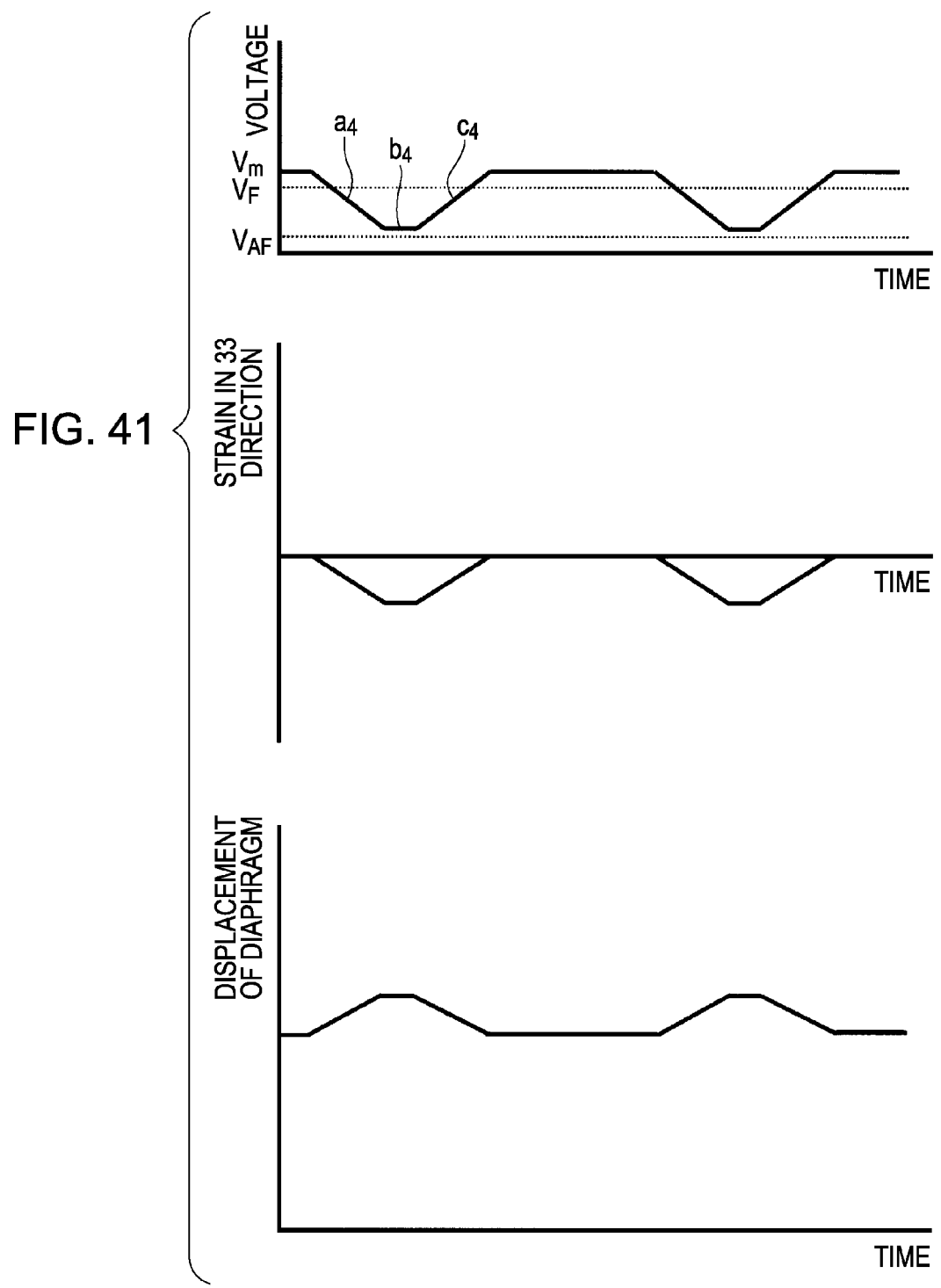
FIG. 41 shows graphs showing a drive waveform having a small amplitude.

A small amplitude can be generated in another drive waveform as shown in FIG. 41. After a voltage higher than $V_F$ is applied, a voltage is applied so as to maintain a predetermined voltage and is held above $V_F$, that is, in the region (i) in FIG. 25. A holding voltage $V_m$ is a starting voltage in FIG. 41. The starting voltage is higher than $V_F$. The voltage is decreased from the starting voltage to $V_{AF}$ or more in an expansion step $a_4$. After a holding step $b_4$, the voltage is increased to the holding voltage $V_m$ in a contraction step $c_4$. In the contraction step $c_4$, the displacement increases linearly with voltage, thus discharging droplets. The voltage can therefore be decreased to generate a small amplitude.

As shown in FIGS. 40 and 41, a starting voltage higher than $V_F$ allows the voltage to be either increased or decreased from the starting voltage. A drive waveform that includes both an increase and a decrease in voltage allows precise control of the displacement, that is, the droplet size.

In the antiferroelectric phase region, electric-field-induced phase transition sharply increases or decreases the displacement in a narrow voltage range. The operation of a piezoelectric element across the antiferroelectric phase region can therefore generate a large amplitude. In other words, with a starting voltage passing $V_F$ and having an absolute value higher than $V_{AF}$, a drive signal that decreases the voltage to an absolute value lower than $V_{AF}$ can be applied to a piezoelectric element to generate a large amplitude. Alternatively, with a starting voltage having an absolute value lower than $V_F$ before passing $V_F$, a drive signal that increases the voltage to an absolute value higher than $V_F$ can be applied to a piezoelectric element to generate a large amplitude.

Figure 42:
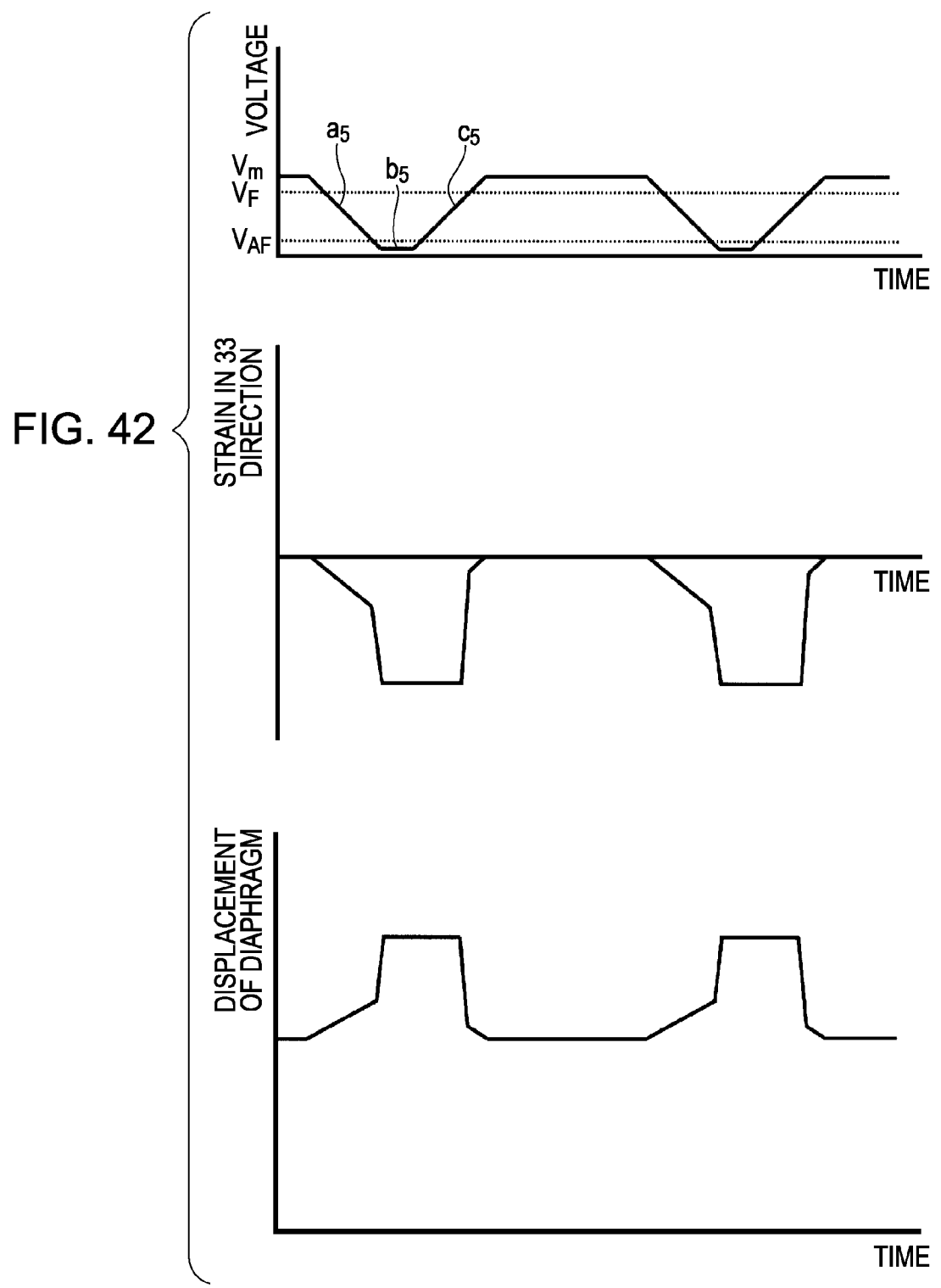
FIG. 42 shows graphs showing a drive waveform of a large amplitude.

FIG. 42 shows a specific example of a drive waveform having a large amplitude. After a voltage higher than $V_F$ is applied, a voltage is applied so as to maintain a predetermined voltage and is held above $V_F$, that is, in the region (i) in FIG. 25. A holding voltage $V_m$ is a starting voltage in FIG. 42. The starting voltage is higher than $V_F$. The voltage is decreased from the starting voltage to a voltage lower than $V_{AF}$ in an expansion step $a_5$. After a holding step $b_5$, the voltage is increased to the holding voltage $V_m$ (a standby state) in a contraction step $c_5$. In the contraction step $c_5$, electric-field-induced phase transition of the antiferroelectric substance increases the piezoelectric strain, thus discharging droplets at a large amplitude.

While a drive signal in a region across $V_{AF}$ is described above with reference to FIG. 42, a large amplitude can also be generated in a region across $V_F$. More specifically, with a starting voltage having an absolute value lower than $V_F$ before passing $V_F$, the voltage is increased from the starting voltage to an absolute value higher than $V_F$ in a contraction step. In the contraction step, electric-field-induced phase transition of the antiferroelectric substance increases the piezoelectric strain, thus discharging droplets at a large amplitude. After a holding step, the voltage can be decreased to the holding voltage (a standby state) in an expansion step.

Figure 43:
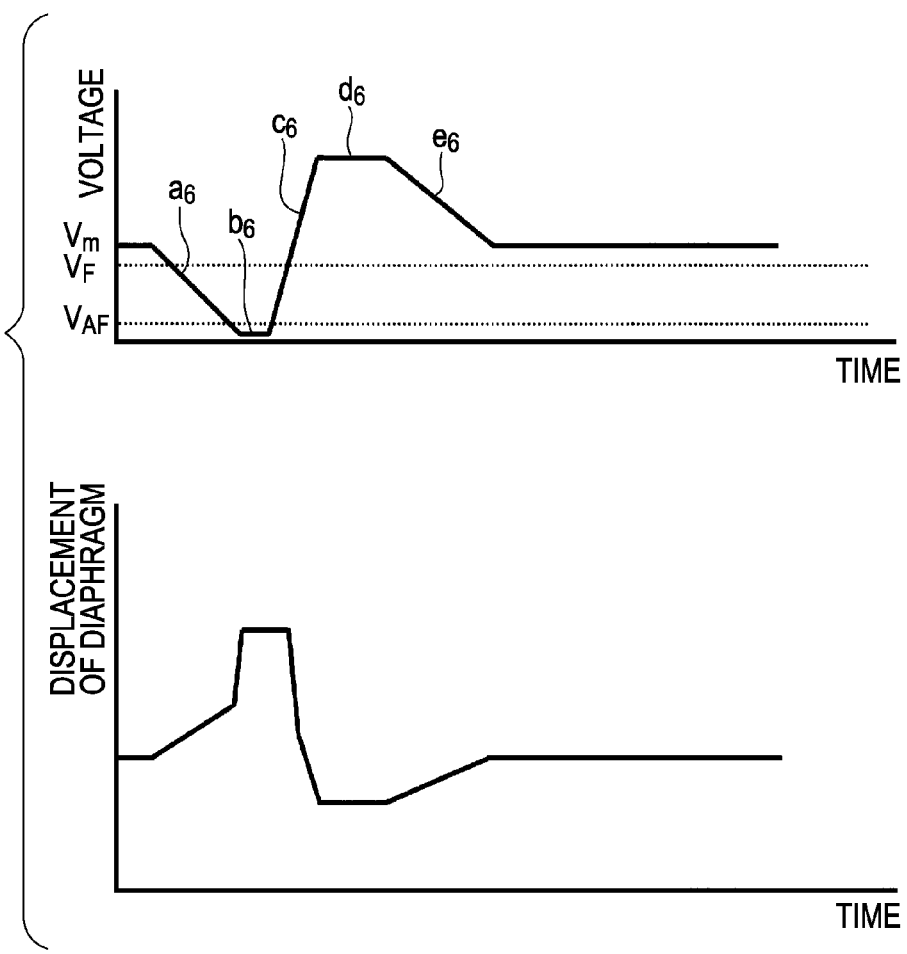
FIG. 43 shows graphs showing a drive waveform of a combination of a small amplitude and a large amplitude.
Figure 44:
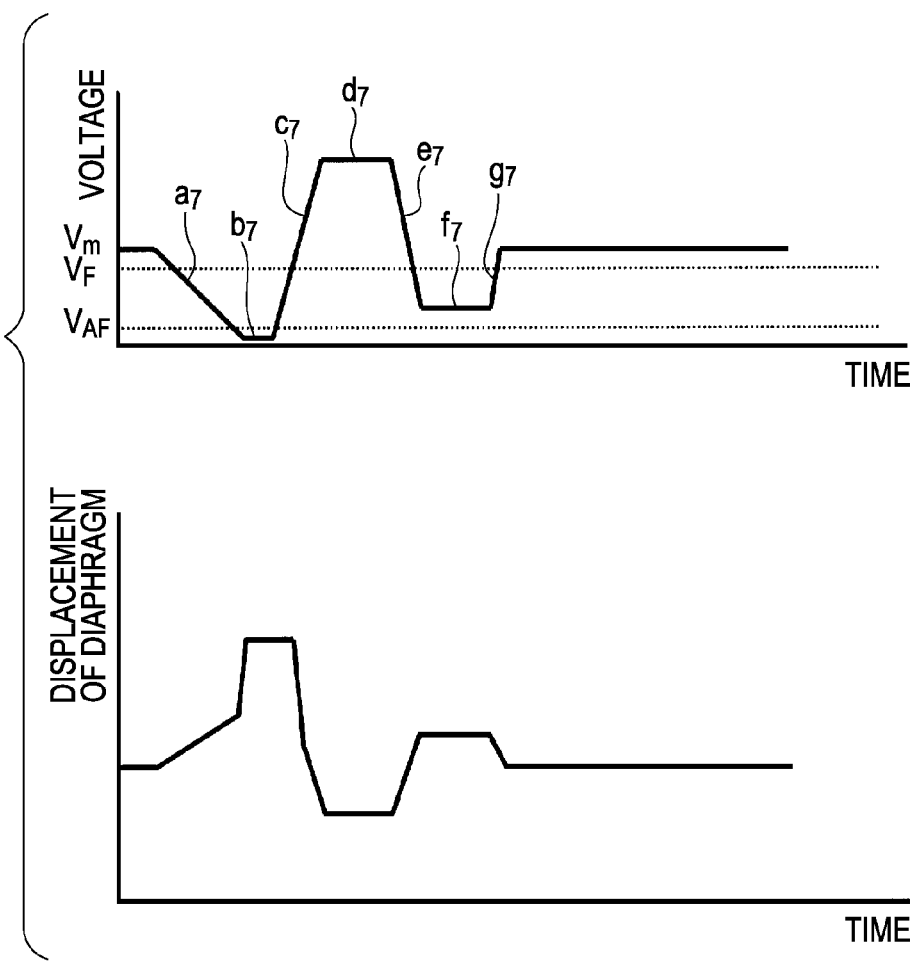
FIG. 44 shows graphs showing a drive waveform of a combination of a small amplitude and a large amplitude.

The drive waveform for generating a small amplitude and the drive waveform for generating a large amplitude can be combined to generate various amplitudes, as shown in FIGS. 43 and 44. In FIG. 43, after a voltage higher than $V_F$ is applied, a voltage is applied so as to maintain a predetermined voltage and is held above $V_F$, that is, in the region (i) in FIG. 25. A holding voltage $V_m$ is a starting voltage in FIG. 43. The starting voltage is higher than $V_F$. The voltage is decreased from the starting voltage to a voltage lower than $V_{AF}$ in an expansion step $a_6$. After a holding step $b_6$, the voltage is increased to a voltage higher than $V_F$ in a contraction step $c_6$. The contraction step $c_6$ corresponds to a combination of the contraction step $c_5$ in FIG. 42, which generates a large amplitude, and the contraction step $a_3$ in FIG. 40, thereby discharging droplets at a much larger amplitude. After a holding step $d_6$, the voltage is decreased to the holding voltage $V_m$ in an expansion step $e_6$.

In FIG. 44, after a voltage higher than $V_F$ is applied, a voltage is applied so as to maintain a predetermined voltage and is held above $V_F$, that is, in the region (i) in FIG. 25. A holding voltage $V_m$ is a starting voltage in FIG. 44. The starting voltage is higher than $V_F$. The voltage is decreased from the starting voltage to a voltage lower than $V_{AF}$ in an expansion step $a_7$. After a holding step $b_7$, the voltage is increased to a voltage higher than $V_F$ in a contraction step $c_7$. The contraction step $c_7$ corresponds to a combination of the contraction step $c_5$ in FIG. 42, which generates a large amplitude, and the contraction step $a_3$ in FIG. 40, thereby discharging droplets at a much larger amplitude. After a holding step $d_7$, the voltage is decreased to a voltage higher than $V_{AF}$ in an expansion step $e_7$. After a holding step $f_7$, the voltage is increased to the holding voltage $V_m$ (a standby state) in a contraction step $g_7$. The holding step $f_7$ and the contraction step $g_7$ allow absorption of vibration and an early recovery to the standby state.

A drive signal controller of a drive unit can selectively send a drive signal for vibration having a small amplitude and a drive signal for vibration having a large amplitude to a piezoelectric element, thereby generating desired vibration.

Other Embodiments

While one embodiment of the invention has been described above, the basic structure of the invention is not limited to the embodiment described above. For example, in the first embodiment, the $ABO_3$ complex oxide only contains Bi, La, Fe, and Mn as metallic elements. However, the $ABO_3$ complex oxide can contain another metal to achieve better piezoelectric characteristics, provided that the $ABO_3$ complex oxide can undergo electric-field-induced phase transition.

Although the flow-passage-forming substrate 10 is a silicon single crystal substrate in the first embodiment, the flow-passage-forming substrate 10 may be an SOI substrate or a glass substrate.

Although the piezoelectric element 300 includes the first electrode 60, the piezoelectric layer 70, and the second electrode 80 on the substrate (the flow-passage-forming substrate 10) in the first embodiment, a piezoelectric material and an electrode-forming material may be alternately stacked to manufacture a longitudinal vibration piezoelectric element, which expands and contracts in the axial direction.

While the ink jet print head has been described as an example of a liquid-ejecting head in the first embodiment, the invention is directed to a wide variety of general liquid-ejecting heads and, as a matter of course, can be applied to liquid-ejecting heads for ejecting liquid other than ink. Examples of other liquid-ejecting heads include print heads for use in image recorders, such as printers, coloring-material-ejecting heads for use in the manufacture of color filters for liquid crystal displays, electrode-material-ejecting heads for use in the formation of electrodes for organic EL displays and field-emission displays (FED), and bioorganic compound-ejecting heads for use in the manufacture of biochips.

The invention can be applied not only to piezoelectric elements installed in liquid-ejecting heads, such as ink jet print heads, but also to piezoelectric elements installed in ultrasonic devices, such as ultrasonic transmitters, ultrasonic motors, pressure sensors, and ferroelectric memories.

What is claimed is:

1. A liquid-ejecting head comprising: a pressure-generating chamber communicating with a nozzle opening; and a piezoelectric element including a piezoelectric layer and a plurality of electrodes, wherein the piezoelectric layer contains a perovskite complex oxide containing Bi, La, Fe, and Mn and the piezoelectric layer undergoes an electric-field-induced phase transition from an antiferroelectric phase to a ferroelectric phase or phase transition from a ferroelectric phase to an antiferroelectric phase.

2. A liquid-ejecting head comprising: a pressure-generating chamber communicating with a nozzle opening; a piezoelectric element including a piezoelectric layer and a plurality of electrodes, wherein the piezoelectric layer contains a complex oxide having the following general formula:

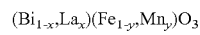

$(Bi_{1-x}, La_x)(Fe_{1-y}, Mn_y)O_3$ $(0.21 \leq x \leq 0.38, 0.01 \leq y \leq 0.09)$; and wherein the piezoelectric layer undergoes an electric-field-induced phase transition from an antiferroelectric phase to a ferroelectric phase or phase transition from a ferroelectric phase to an antiferroelectric phase.

3. The liquid-ejecting head according to claim 2, wherein the x is in the range of $0.24 \leq x \leq 0.33$.

4. The liquid-ejecting head according to claim 2, wherein the x is in the range of $0.27 \leq x \leq 0.29$.

5. The liquid-ejecting head according to claim 2, wherein the y is in the range of $0.01 \leq y \leq 0.05$.

6. A liquid-ejecting apparatus comprising the liquid-ejecting head according to claim 1.

7. A liquid-ejecting apparatus comprising the liquid-ejecting head according to claim 2.

8. A liquid-ejecting apparatus comprising the liquid-ejecting head according to claim 3.

9. A liquid-ejecting apparatus comprising the liquid-ejecting head according to claim 4.

10. A liquid-ejecting apparatus comprising the liquid-ejecting head according to claim 5.

11. A piezoelectric element including a piezoelectric layer and a plurality of electrodes, wherein the piezoelectric layer contains a piezoelectric material which has a perovskite complex oxide containing Bi, La, Fe, and Mn, wherein the piezoelectric material undergoes electric-field-induced phase transition from an antiferroelectric phase to a ferroelectric phase or phase transition from a ferroelectric phase to an antiferroelectric phase.

* * * * *